(12) United States Patent
Krishnaswami et al.

(10) Patent No.: US 7,786,742 B2
(45) Date of Patent: Aug. 31, 2010

(54) PROBER FOR ELECTRONIC DEVICE TESTING ON LARGE AREA SUBSTRATES

(75) Inventors: Sriram Krishnaswami, Saratoga, CA (US); Matthias Brunner, Kirchheim (DE); William Beaton, San Mateo, CA (US); Yong Liu, San Jose, CA (US); Benjamin M. Johnston, Los Gatos, CA (US); Hung T. Nguyen, Fremont, CA (US); Ludwig Ledl, Groebenzell (DE); Ralf Schmid, Poing (DE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/746,530

(22) Filed: May 9, 2007

(65) Prior Publication Data
US 2007/0296426 A1    Dec. 27, 2007

Related U.S. Application Data

(60) Provisional application No. 60/803,595, filed on May 31, 2006, provisional application No. 60/821,904, filed on Aug. 9, 2006, provisional application No. 60/803,597, filed on May 31, 2006.

(51) Int. Cl.
*G01R 31/02* (2006.01)
(52) U.S. Cl. ........................................ 324/754; 324/758
(58) Field of Classification Search ........................ None
See application file for complete search history.

(56) References Cited

U.S. PATENT DOCUMENTS

| | | | |
|---|---|---|---|
| 3,830,480 A * | 8/1974 | Grant | 266/99 |
| 3,983,401 A | 9/1976 | Livesay | |
| 4,090,056 A | 5/1978 | Lockwood et al. | |
| 4,362,945 A | 12/1982 | Rieke | |
| 4,437,044 A | 3/1984 | Veith | |
| 4,471,298 A | 9/1984 | Frohlich | |

(Continued)

FOREIGN PATENT DOCUMENTS

DE    3636316    5/1989

(Continued)

OTHER PUBLICATIONS

Brunner, et al. "Development of Puma 5500/10K Platform," AKT News, vol. 5, Jan. 2001, pp. 13-14.

(Continued)

*Primary Examiner*—Minh N Tang
(74) *Attorney, Agent, or Firm*—Patterson & Sheridan, LLP

(57) ABSTRACT

An apparatus and method for testing large area substrates is described. The large area substrates include patterns of displays and contact points electrically coupled to the displays on the large area substrate. The apparatus includes a prober assembly that is movable relative to the large area substrate and/or the contact points, and may be configured to test various patterns of displays and contact points on various large area substrates. The prober assembly is also configured to test fractional sections of the large area substrate positioned on a testing table, and the prober assembly may be configured for different display and contact point patterns without removing the prober assembly from the testing table.

18 Claims, 14 Drawing Sheets

U.S. PATENT DOCUMENTS

| | | |
|---|---|---|
| 4,495,966 A | 1/1985 | Longamore |
| 4,528,452 A | 7/1985 | Livesay |
| 4,532,423 A | 7/1985 | Tojo et al. |
| 4,684,808 A | 8/1987 | Plies |
| 4,725,736 A | 2/1988 | Crewe |
| 4,740,705 A | 4/1988 | Crewe |
| 4,760,567 A | 7/1988 | Crewe |
| 4,761,607 A | 8/1988 | Shiragasawa et al. |
| 4,764,818 A | 8/1988 | Crew |
| 4,772,846 A | 9/1988 | Reeds |
| 4,795,912 A | 1/1989 | Maschke |
| 4,818,933 A | 4/1989 | Kerschner et al. |
| 4,819,038 A | 4/1989 | Alt |
| 4,843,312 A | 6/1989 | Hartman et al. |
| 4,862,075 A | 8/1989 | Choi |
| 4,870,357 A | 9/1989 | Young |
| 4,899,105 A | 2/1990 | Akiyama |
| 4,965,515 A | 10/1990 | Karasawa |
| 4,983,833 A | 1/1991 | Brunner et al. |
| 4,985,676 A | 1/1991 | Karasawa |
| 4,985,681 A | 1/1991 | Brunner et al. |
| 5,081,687 A | 1/1992 | Henley et al. |
| 5,124,635 A | 6/1992 | Henley |
| 5,170,127 A | 12/1992 | Henley |
| 5,175,495 A | 12/1992 | Brahme et al. |
| 5,177,437 A | 1/1993 | Henley |
| 5,258,706 A | 11/1993 | Brunner et al. |
| 5,268,638 A | 12/1993 | Brunner et al. |
| 5,278,494 A | 1/1994 | Obigane |
| 5,285,150 A | 2/1994 | Henley |
| 5,313,156 A | 5/1994 | Klug et al. |
| 5,365,034 A | 11/1994 | Kawamura et al. |
| 5,368,676 A | 11/1994 | Nagaseki et al. |
| 5,369,359 A | 11/1994 | Schmitt |
| 5,371,459 A | 12/1994 | Brunner et al. |
| 5,414,374 A | 5/1995 | Brunner et al. |
| 5,416,592 A | 5/1995 | Mori et al. |
| 5,430,292 A | 7/1995 | Honjo et al. |
| 5,432,461 A | 7/1995 | Henley |
| 5,459,410 A | 10/1995 | Henley |
| 5,504,438 A | 4/1996 | Henley |
| 5,521,522 A | 5/1996 | Abe et al. |
| 5,528,158 A | 6/1996 | Sinsheimer et al. |
| 5,530,370 A | 6/1996 | Larighof et al. |
| 5,558,717 A | 9/1996 | Zhao |
| 5,621,333 A | 4/1997 | Long et al. |
| 5,644,245 A | 7/1997 | Saitoh et al. |
| 5,657,139 A | 8/1997 | Hayashi |
| 5,691,764 A | 11/1997 | Takeoshi et al. |
| 5,742,173 A | 4/1998 | Nakagomi et al. |
| 5,774,100 A | 6/1998 | Aoki et al. |
| 5,801,545 A | 9/1998 | Takeoshi et al. |
| 5,801,764 A | 9/1998 | Koizumi et al. |
| 5,834,007 A | 11/1998 | Kubota |
| 5,834,773 A | 11/1998 | Brunner et al. |
| 5,892,224 A | 4/1999 | Nakasuji |
| 5,923,180 A | 7/1999 | Botka et al. |
| 5,930,607 A | 7/1999 | Satou |
| 5,936,687 A | 8/1999 | Lee |
| 5,973,323 A | 10/1999 | Adler et al. |
| 5,982,190 A | 11/1999 | Toro-Lira |
| 5,985,190 A | 11/1999 | Toro-Lira |
| 6,033,281 A | 3/2000 | Toro-Lira |
| 6,046,599 A | 4/2000 | Long et al. |
| 6,075,245 A | 6/2000 | Toro-Lira |
| 6,086,362 A | 7/2000 | White et al. |
| 6,137,303 A | 10/2000 | Deckert et al. |
| 6,145,648 A | 11/2000 | Teichman et al. |
| 6,191,598 B1 | 2/2001 | Hollman |
| 6,198,299 B1 | 3/2001 | Hollman |
| 6,265,889 B1 | 7/2001 | Tomita et al. |
| 6,281,701 B1 | 8/2001 | Yang et al. |
| 6,288,561 B1 | 9/2001 | Leedy |
| 6,297,656 B1 | 10/2001 | Kobayashi et al. |
| 6,320,568 B1 | 11/2001 | Zavracky |
| 6,337,722 B1 | 1/2002 | Ha |
| 6,337,772 B2 | 1/2002 | Uehara et al. |
| 6,340,963 B1 | 1/2002 | Anno et al. |
| 6,343,369 B1 | 1/2002 | Saunders et al. |
| 6,356,098 B1 | 3/2002 | Akram et al. |
| 6,362,013 B1 | 3/2002 | Yoshimura et al. |
| 6,380,729 B1 | 4/2002 | Smith |
| 6,435,868 B2 | 8/2002 | White et al. |
| 6,450,469 B1 | 9/2002 | Okuna |
| 6,501,289 B1 | 12/2002 | Takeoshi |
| 6,528,767 B2 | 3/2003 | Bagley et al. |
| 6,559,454 B1 | 5/2003 | Murrell et al. |
| 6,566,897 B2 | 5/2003 | Lo et al. |
| 6,570,553 B2 | 5/2003 | Hashimoto et al. |
| 6,730,906 B2 | 5/2004 | Brunner et al. |
| 6,765,203 B1 | 7/2004 | Abel |
| 6,777,675 B2 | 8/2004 | Parker et al. |
| 6,798,231 B2 | 9/2004 | Iwasaki et al. |
| 6,828,587 B2 | 12/2004 | Yamazaki et al. |
| 6,833,717 B1 | 12/2004 | Kurita et al. |
| 6,836,140 B2 | 12/2004 | Fujikawa et al. |
| 6,873,175 B2 | 3/2005 | Toro-Lira |
| 6,985,193 B2 | 1/2006 | Jang et al. |
| 6,992,290 B2 | 1/2006 | Watanabe et al. |
| 6,995,576 B2 | 2/2006 | Imai |
| 7,005,641 B2 | 2/2006 | Nakasuji et al. |
| 7,043,848 B2 | 5/2006 | Hollman et al. |
| 7,077,019 B2 | 7/2006 | Weis et al. |
| 7,084,970 B2 | 8/2006 | Weiss et al. |
| 7,088,117 B2 | 8/2006 | Uher et al. |
| 7,137,309 B2 | 11/2006 | Weis et al. |
| 7,180,084 B2 | 2/2007 | Weis et al. |
| 7,189,998 B2 | 3/2007 | Cha et al. |
| 7,319,450 B2 | 1/2008 | Choi et al. |
| 7,327,158 B1 | 2/2008 | Jun |
| 7,332,869 B2 | 2/2008 | Yoo et al. |
| 2001/0035767 A1 | 11/2001 | Listwan |
| 2001/0052788 A1 | 12/2001 | Tomita |
| 2002/0024023 A1 | 2/2002 | Brunner et al. |
| 2002/0034886 A1 | 3/2002 | Kurita et al. |
| 2002/0047838 A1 | 4/2002 | Aoki et al. |
| 2003/0209323 A1 | 11/2003 | Yokogaki |
| 2003/0218456 A1 | 11/2003 | Brunner et al. |
| 2004/0145383 A1 | 7/2004 | Brunner et al. |
| 2005/0040338 A1 | 2/2005 | Weis et al. |
| 2005/0179451 A1 | 8/2005 | Brunner et al. |
| 2005/0179452 A1 | 8/2005 | Brunner et al. |
| 2005/0254045 A1 | 11/2005 | Weiss et al. |
| 2006/0038554 A1 | 2/2006 | Kurita et al. |
| 2006/0096395 A1 | 5/2006 | Weiss et al. |
| 2006/0226865 A1 | 10/2006 | Gallarda et al. |
| 2006/0237627 A1 | 10/2006 | Gardner et al. |
| 2006/0279304 A1 | 12/2006 | Kuitani et al. |
| 2007/0030478 A1 | 2/2007 | Kim et al. |
| 2007/0109011 A1 | 5/2007 | Jun et al. |
| 2007/0109278 A1 | 5/2007 | Moon |
| 2007/0164773 A1 | 7/2007 | Moon et al. |
| 2008/0002137 A1 | 1/2008 | Kim et al. |
| 2008/0024157 A1 | 1/2008 | Jun |
| 2008/0036905 A1 | 2/2008 | Moon et al. |
| 2008/0036933 A1 | 2/2008 | Na et al. |
| 2008/0044996 A1 | 2/2008 | Baek et al. |

FOREIGN PATENT DOCUMENTS

| | | |
|---|---|---|
| DE | 19832297 | 9/2001 |
| EP | 0204855 | 12/1986 |
| EP | 0370276 | 1/1991 |
| EP | 0402499 | 9/1991 |

| | | |
|---|---|---|
| EP | 0537505 | 11/1993 |
| EP | 0523594 | 12/1993 |
| EP | 0523584 | 6/1994 |
| EP | 0614090 | 9/1994 |
| EP | 0542094 | 11/1994 |
| EP | 0762137 | 3/1997 |
| EP | 0806700 | 11/1997 |
| EP | 0932182 | 7/1999 |
| EP | 0999573 | 5/2000 |
| EP | 1045425 | 10/2000 |
| EP | 1045426 | 10/2000 |
| EP | 1233274 | 8/2002 |
| JP | 60-039748 | 3/1985 |
| JP | 63-88741 | 4/1988 |
| JP | 63-88742 | 4/1988 |
| JP | 63-166132 | 7/1988 |
| JP | 63-318054 | 12/1988 |
| JP | 1-307148 | 12/1989 |
| JP | 6-167538 | 6/1994 |
| JP | 7-302563 | 11/1995 |
| JP | 8-173418 | 7/1996 |
| JP | 8-289231 | 11/1996 |
| JP | 11174108 A | 7/1999 |
| JP | 1-213944 | 8/1999 |
| JP | 11-264940 | 9/1999 |
| JP | 2000-180392 | 6/2000 |
| JP | 2000-223057 | 8/2000 |
| JP | 2000-268764 | 9/2000 |
| JP | 2001-033408 | 2/2001 |
| JP | 2001-318116 | 11/2001 |
| JP | 2001-358189 | 12/2001 |
| JP | 2002-039976 | 2/2002 |
| JP | 2002-048740 | 2/2002 |
| JP | 2002-257997 | 9/2002 |
| JP | 2002-310959 | 10/2002 |
| JP | 2002-343294 | 11/2002 |
| JP | 2004-014402 | 1/2004 |
| KR | 20000067096 | 11/2000 |
| KR | 20040061673 | 7/2004 |
| KR | 100449515 | 9/2004 |
| KR | 100490056 | 5/2005 |
| KR | 20050075636 | 7/2005 |
| KR | 20060123003 | 12/2006 |
| KR | 20060128446 | 12/2006 |
| KR | 20070019061 | 2/2007 |
| KR | 20070039667 | 4/2007 |
| KR | 20070063315 | 6/2007 |
| KR | 20070067761 | 6/2007 |
| KR | 20070083007 | 8/2007 |
| KR | 20070117184 | 12/2007 |
| KR | 20070117188 | 12/2007 |
| KR | 20070117190 | 12/2007 |
| KR | 20070117191 | 12/2007 |
| TW | 344876 | 11/1998 |
| TW | 427551 | 3/2001 |
| TW | 459140 | 10/2001 |
| TW | 473772 | 1/2002 |
| TW | 511207 | 11/2002 |
| TW | 512428 | 12/2002 |
| TW | 536630 | 6/2003 |
| TW | 2003-01535 | 7/2003 |
| TW | 541430 | 7/2003 |
| TW | 200532178 A | 10/2005 |
| WO | WO 92-09900 | 6/1992 |
| WO | WO 98-31050 | 7/1998 |
| WO | WO 99-23684 | 5/1999 |
| WO | WO 99-60614 | 11/1999 |
| WO | WO 02-33745 | 4/2002 |
| WO | WO 02-45137 | 6/2002 |

OTHER PUBLICATIONS

Brunner, M., "TFT Array Testing: Replacing Mechanics by Electron Beam Deflection," AKT News, vol. 6, Apr. 2001, pp. 15-17.
Invitation to pay additional fees dated Oct. 21, 2003 for PCT/US03/15903.
European Search Report for EP 03 026 267.9, dated Apr. 5, 2004.
Invitation to pay additional fees dated May 11, 2005 for PCT/US04/043202.
PCT Search Report and Written Opinion for PCT/US2004/043202, dated Jul. 28, 2005.
TIPO Official Action for patent application No. 94123638, dated Dec. 25, 2006.
German Search Report, dated Jul. 18, 2003 for DE 10253717.8.
German Examination Report, dated Jul. 14, 2003 for DE 10253717.8.
PCT English Translation of International Preliminary Exam for PCT/EP03/06481, dated Mar. 10, 2005.
PCT International Search Report for PCT/US03/15903, dated Jan. 16, 2004.
PCT Search Report and Written Opinion for PCT/US2005/26866, dated Aug. 30, 2006.
International Search Report and Written Opinion of the International Searching Authority, mailed Feb. 5, 2008 (PCT/US07/68642).
Chinese Office Action for Application No. 200710105270.9, dated Apr. 10, 2009.
Kumada, et al.; "Non-Contact Array Testers" LCD Panel Process Inspection Technology (No. 10); 2002.
"Submission of Information" received Sep. 11, 2009 in Korean Application No. 10-2007-0050207.
Search Report for Taiwan Invention Patent Application No. 096117479; research date Mar. 15, 2010.
Second Office Action for Chinese Patent Application No. 2010051300396330 dated May 18, 2010.

* cited by examiner

PROBER FOR ELECTRONIC DEVICE TESTING ON LARGE AREA SUBSTRATES

CROSS-REFERENCE TO RELATED APPLICATIONS

This application claims benefit of U.S. Provisional Patent Application Ser. No. 60/803,595, filed May 31, 2006, and U.S. Provisional Patent Application Ser. No. 60/821,904, filed Aug. 9, 2006, each of the aforementioned patent applications incorporated herein by reference. This application is also related to U.S. Provisional Patent Application Ser. No. 60/803,597, filed May 31, 2006, which is incorporated herein by reference.

BACKGROUND OF THE INVENTION

1. Field of the Invention

Embodiments of the present invention generally relate to a test system for substrates. More particularly, the invention relates to an integrated testing system for large area substrates in the production of flat panel displays.

2. Description of the Related Art

Flat panel displays, sometimes referred to as active matrix liquid crystal displays (LCD's), have recently become commonplace in the world as a replacement for the cathode ray tubes of the past. The LCD has several advantages over the CRT, including higher picture quality, lighter weight, lower voltage requirements, and low power consumption. The displays have many applications in computer monitors, cell phones and televisions to name but a few.

One type of active matrix LCD includes a liquid crystal material sandwiched between a thin film transistor (TFT) array substrate and a color filter substrate to form a flat panel substrate. Generally, the TFT substrate includes an array of thin film transistors, each coupled to a pixel electrode, and the color filter substrate includes different color filter portions and a common electrode. When a certain voltage is applied to a pixel electrode, an electric field is created between the pixel electrode and the common electrode, orienting the liquid crystal material to allow light to pass therethrough for that particular pixel. The substrates used typically include a large surface area and many independent flat panel displays are formed on the large area substrate, which are subsequently separated from the substrate during final manufacturing.

A part of the manufacturing process requires testing of the large area substrate to determine the operability of pixels in each flat panel display. Voltage imaging, charge sensing, optical imaging, and electron beam testing are some processes used to monitor and troubleshoot defects during the manufacturing process. In a typical electron beam testing process, TFT response within the pixels is monitored to provide defect information. In one example of electron beam testing, certain voltages are applied to the TFT's, and an electron beam may be directed to the individual pixel electrodes under investigation. Secondary electrons emitted from the pixel electrode area are sensed to determine the TFT voltages.

Generally, a test apparatus, such as a prober assembly, is used to apply or sense voltages from the TFT's by contacting conductive areas on the large area substrate. The prober assembly is sized and adapted to test a specific configuration of flat panel displays laid out on the substrate. The prober assembly typically has an area sized equal to or greater than the dimensions of the substrate, and this large area of the prober assembly creates handling, transfer, and storage challenges. The prober assemblies are also generally designed to test one specific configuration of flat panel displays, or product, wherein a different prober assembly is needed whenever the product is different. Since manufacturers typically produce many different products, this may increase the number of prober assemblies needed, which again create storage, transfer, and handling challenges.

Therefore, there is a need for a prober assembly to perform testing on large area substrates that addresses some of the challenges discussed above.

SUMMARY OF THE INVENTION

Embodiments described herein relate to testing electronic devices on large area substrates. In one embodiment, a prober assembly is described. The prober assembly includes a frame, and a plurality of contact heads movably coupled to the frame, wherein each of the contact heads are oriented independently in a direction parallel to the frame, in a direction orthogonal to the frame, in an angle relative to the frame, and combinations thereof.

In another embodiment, a prober assembly is described. The prober assembly includes a frame, and a plurality of contact head assemblies movably coupled to the fame, each contact head assembly includes a housing, and a contact head having a plurality of prober pins disposed on a lower surface thereof, wherein each of the contact head assemblies are independently movable relative a length of the frame, and each of the contact heads are movable relative to the housing.

In another embodiment, a test system for testing a rectangular, large area substrate is described. The test system includes a testing table sized to receive the substrate having a plurality of electronic devices located thereon, and a prober assembly having a plurality of contact heads adapted to selectively contact the electronic devices on the substrate, wherein the prober assembly is movable along a length of the testing table.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The term substrate as used herein refers generally to large area substrates made of glass, a polymeric material, or other substrate materials suitable for having an electronic device formed thereon. Various embodiments are described herein relate to testing electronic devices, such as TFT's and pixels located on flat panel displays. Other electronic devices that may be located on a large area substrate and tested include photovoltaic cells for solar cell arrays, organic light emitting diodes (OLED's), among other devices. The testing procedures are exemplarily described using an electron beam or charged particle emitter, but certain embodiments described herein may be equally effective using optical devices, charge sensing, or other testing applications configured to test electronic devices on large substrates in vacuum conditions, or at or near atmospheric pressure.

Embodiments depicted in this application will refer to various drives, motors and actuators that may be one or a combination of the following: a pneumatic cylinder, a piezoelectric motor, a hydraulic cylinder, a magnetic drive, a stepper or servo motor, a screw type actuator, or other type of motion device that provides vertical movement, horizontal movement, combinations thereof, or other device suitable for providing at least a portion of the described motion.

Various components described herein may be capable of independent movement in horizontal and vertical planes. Vertical is defined as movement orthogonal to a horizontal plane and will be referred to as the Z direction. Horizontal is defined as movement orthogonal to a vertical plane and will be referred to as the X or Y direction, the X direction being movement orthogonal to the Y direction, and vice-versa. The X, Y, and Z directions will be further defined with directional insets included as needed in the Figures to aid the reader.

Figure 1:
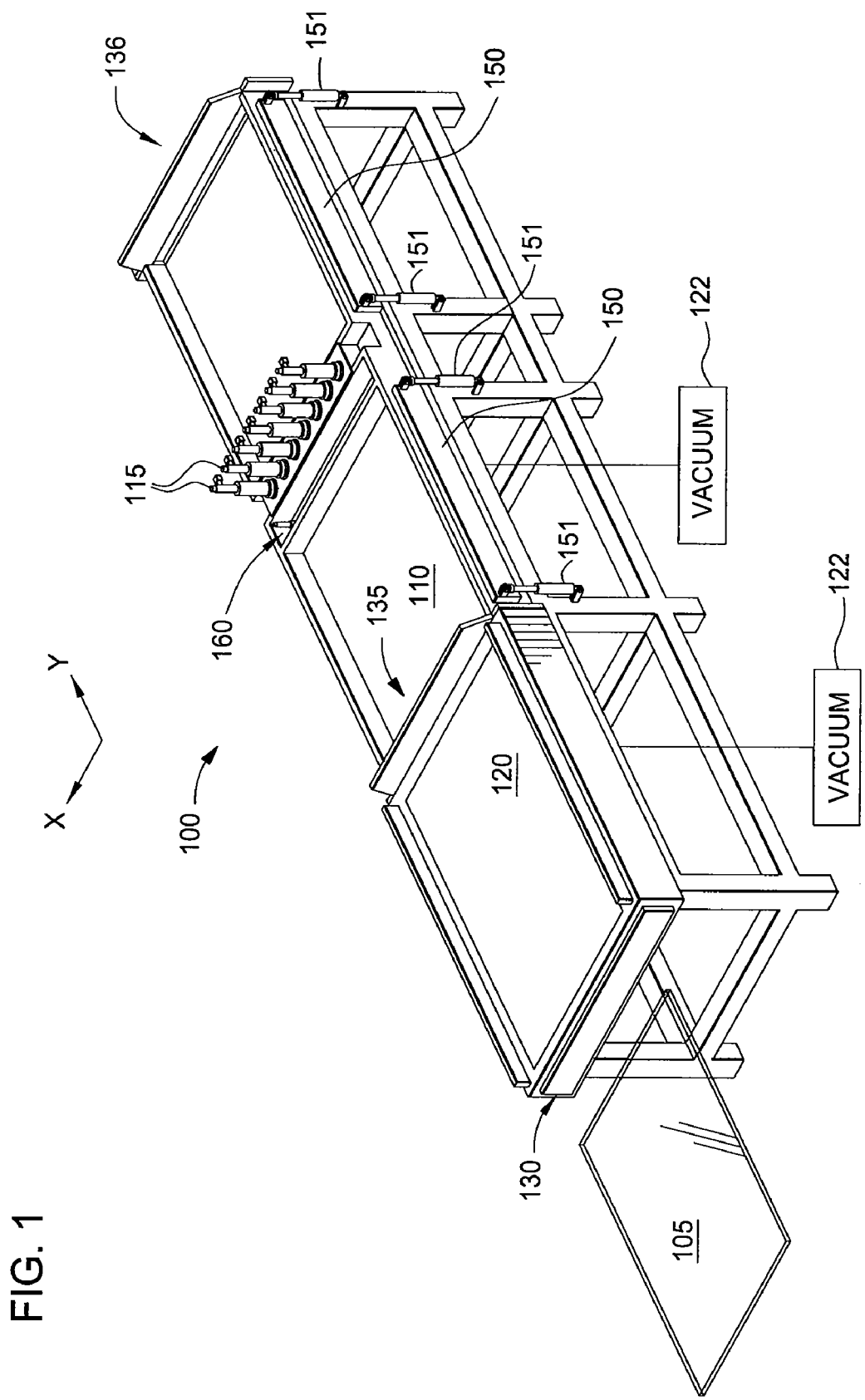
FIG. 1 is an isometric view of one embodiment of a test system.

FIG. 1 is an isometric view of one embodiment of a test system 100 adapted to test the operability of electronic devices located on large area substrates, for example, large area substrates having dimensions up to and exceeding about 2200 mm by about 2600 mm. The test system 100 includes a testing chamber 110, a load lock chamber 120, and a plurality of testing columns 115 (seven are shown in FIG. 1), which are exemplarily described as electron beam columns adapted to test electronic devices located on large area substrates, such as thin film transistors (TFT's). A plurality of sensing devices (not shown) to sense backscattered electrons are located adjacent the testing columns 115 within the interior volume of the testing chamber 110. The test system 100 is typically located in a clean room environment and may be part of a manufacturing system that includes substrate handling equipment such as robotic equipment or a conveyor system that transports one or more large area substrates 105 to and from the testing system 100. In one embodiment, the test system 100 also includes a microscope assembly 160 coupled to an upper surface of the testing chamber 110 to view areas of interest encountered on the large area substrate as the substrate is disposed in the testing chamber 110.

The interior of the testing chamber 110 is accessible at least through a valve 135 between the load lock chamber 120 and the testing chamber 110. The interior may also be accessed by one or more movable sidewalls 150, each including at least one actuator 151, to facilitate opening and closing of the movable sidewalls 150 alone, or in combination. The movable sidewalls 150 provide access for maintenance and inspection of the interior of the testing chamber 110, and facilitate transfer of one or more testing devices, such as a prober assembly (not shown), to and from the interior of the testing chamber 110. The movable sidewalls 150 are configured to provide vacuum sealing to the testing chamber 110 when closed by the use of O-rings, gaskets, and the like. In another embodiment (not shown), an upper surface of the testing chamber 110 may be adapted to open and close for access to the interior and/or to facilitate transfer of one or more testing devices. At least an upper surface of the testing chamber 110 may be hinged, be adapted to raise and lower, move laterally, or combinations thereof. An example of various components of an electron beam test system for testing large area substrates are described in U.S. patent application Ser. No. 11/375,625, filed Mar. 14, 2006 and published as U.S. Patent Publication No. 2006/0244467 on Nov. 2, 2006, U.S. patent application Ser. No. 11/190,320, filed Jul. 27, 2005 and published as U.S. Patent Publication No. 2006/0038554 on Feb. 23, 2006, and U.S. Pat. No. 6,833,717, which issued Dec. 21, 2004, entitled "Electron Beam Test System with Integrated Substrate Transfer Module," which applications are incorporated by reference herein.

The load lock chamber 120 is selectively sealable from ambient environment and is typically coupled to one or more vacuum pumps 122, and the testing chamber 110 may be coupled to one or more vacuum pumps 122 that are separate from the vacuum pumps of the load lock chamber 120. An example of various components of an electron beam test system for testing large area substrates are described in U.S. Patent Publication No. 2006/0244467, filed Mar. 14, 2006, and U.S. Pat. No. 6,833,717, which issued Dec. 21, 2004, which applications are incorporated by reference herein.

In one embodiment, the load lock chamber 120 is adapted to receive the large area substrate 105 from the clean room environment through an entry port 130, facilitate transfer of the substrate from the load lock chamber 120 to the testing chamber 110 through the valve 135, and return the large area substrate to the clean room environment in a converse manner. In another embodiment, the large area substrate 105 enters the test system 100 through the entry port 130, which is then transferred from the load lock chamber 120 to the testing chamber 110 through the valve 135, and the large area substrate is returned to the clean room environment through a port 136 coupled to the opposite end of the testing chamber 110. Alternatively, one or more load lock chambers may be coupled orthogonally to the Y axis or Y direction of the testing chamber 110 to form a "U" shaped processing system or a "Z" shaped processing system (not shown). Other embodiments of the testing chamber 110 and various embodiments of substrate entry/exit arrangements are more fully described in U.S. Patent Publication No. 2006/0244467, previously incorporated by reference.

The load lock chamber 120 may be a dual slot load lock chamber configured to facilitate transfer of at least two large area substrates. Examples of a dual slot load lock chamber are described in U.S. Pat. No. 6,833,717, previously incorporated by reference, and U.S. Patent Publication No. 2006/0273815, filed Dec. 8, 2005, and U.S. Provisional Patent application No. 60/911,496, filed Apr. 12, 2007, both of which are incorporated by reference herein.

Embodiments described herein are adapted to be used in the test system 100 to test the operability of electronic devices on the large area substrates as described above. The prober assemblies used to facilitate the testing of the electronic devices are adapted to be configurable to adapt to various display layouts on multiple large area substrates to minimize transfer of prober assemblies to the testing chamber 110. The minimization of prober transfer thus enables greater throughput to the system. Two exemplary prober assemblies will be now be described that may be used in the test system 100.

Figure 2A:
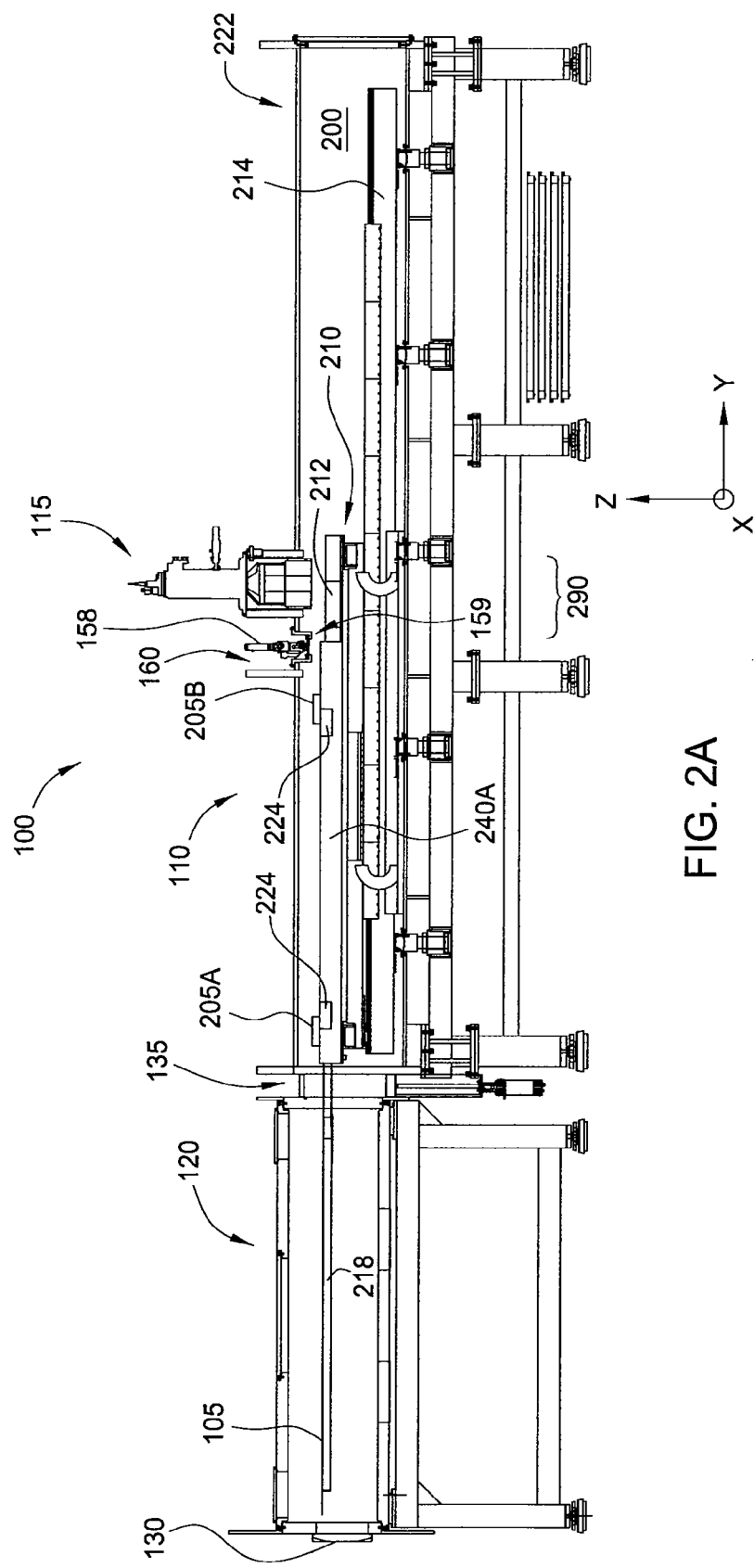
FIG. 2A is a sectional side view of the test system shown in FIG. 1.

FIG. 2A is a sectional side view of the test system 100 shown in FIG. 1. The testing chamber 110 is coupled to the load lock chamber 120, which includes a substrate 105 disposed therein. The testing chamber 110 includes an interior volume 200, which includes a testing table 210 disposed and movable along a frame 214A (only one side is shown), two prober assemblies, such as prober 205A and prober 205B. The probers 205A, 205B are at least partially supported and movable along a prober support 240A, 240B on opposing sides (only 240A is shown in this view) of the testing table 210. The testing table 210 is movable throughout the length of the interior volume 200 along the frame 214A by a drive (not shown) coupled between the frame 214A and the testing table 210. The probers 205A, 205B are movable along the length of the prober support 240 by plurality of drives 224 coupled to one or both of the prober 205A, 205B and the prober supports 240A, 240B. In another embodiment (not shown), the interior volume 200 is adapted to include more than two prober assemblies, wherein at least one of the prober assemblies may be used or readied for a testing sequence, and the other prober assemblies are stored in the interior volume 200.

In one embodiment, the testing table 210 includes three substantially planar stages stacked on one another. In one aspect, each of the three stages independently move along orthogonal axes, such as X, Y, and Z directions. The upper stage 212 is configured to support the substrate 105 during testing and includes multiple panels having slots therebetween to receive a plurality of fingers (shown in FIG. 2B) of an end effector 214. In one embodiment, the upper stage 212 moves at least in the Z direction and the upper effector 214 extends laterally (Y direction) therefrom to transfer the substrate to and from the load lock chamber 120. Details of an end effector and testing table can be found U.S. Publication No. 2006/0244467, previously incorporated by reference.

In one embodiment, the test system 100 is configured to transport a large area substrate 105 having electronic devices located thereon through a testing sequence along a single directional axis, shown in the Figure as the Y direction. Specifically, the substrate 105 is moved in a single directional axis through a test zone 290 formed by the addressable area of the plurality of testing columns 115 on the substrate. In other embodiments, the testing sequence and/or pre-testing or post-testing may include a combination of movement along the X and Y axis. For example, the substrate 105 may be moved by one or both of the upper stage 212 and the end effector 218 to correct misalignment in substrate position before testing. In other embodiments, the testing sequence may include Z directional movement provided by one or both of the testing columns 115 and testing table 210.

The substrate 105 may be introduced into the test system 100 along either the substrate width or substrate length. The Y directional movement of the substrate 105 in the test system allows the system dimensions to be slightly larger than the width or length dimensions of the substrate 105. The movement of the support table along a single directional axis may also eliminate or minimize the drives required to move the support table in the X direction. The height of the load lock chamber 120 and the testing chamber 110 can be minimized as a result of the unidirectional movement. The reduced height combined with the minimal width of the testing system provides a smaller volume in the load lock chamber 120 and the testing chamber 110. This reduced volume decreases pump-down and vent time in the load lock chamber 120 and the testing chamber 110, thereby enhancing throughput of the test system 100.

The testing chamber 110 also includes a top 222 that may include a microscope assembly 160, which comprises a microscope 158 movably positioned above a view port 159 formed in the top 222. The view port 159 is a transparent strip made of glass, plastic, quartz, or other transparent material, and is configured to withstand negative pressure that is selectively present in the interior volume 200 of the testing chamber 110. In one embodiment, one or both of the microscope 158 and microscope assembly 160 moves horizontally (X direction) to view areas of interest on the substrate when the substrate is positioned below the view port 159. In a specific embodiment, the microscope 158 comprises a focus module (not shown) to allow adjustment to depth of field.

In one embodiment, the probers 205A, 205B are provided to the testing table 210 through one or more movable sidewalls 150 (FIG. 1). The probers 205A, 205B may be transferred to the testing table 210 manually, or by a prober transfer apparatus (not shown) adapted to transfer the probers alone, or together, from the clean room environment to the testing table 210. In one embodiment, one, or more than two probers, may be provided to the testing chamber 110 to use in a testing procedure or for storage in the interior volume 200. The probers 205A, 205B are at least partially supported by the prober supports 240 along opposing sides of the testing table 210. The probers 205A, 205B are adapted to move horizontally (Y direction) along the length of the prober supports 240A, 240B and are adapted to test the electronic devices located on the substrate 105.

Figure 2B:
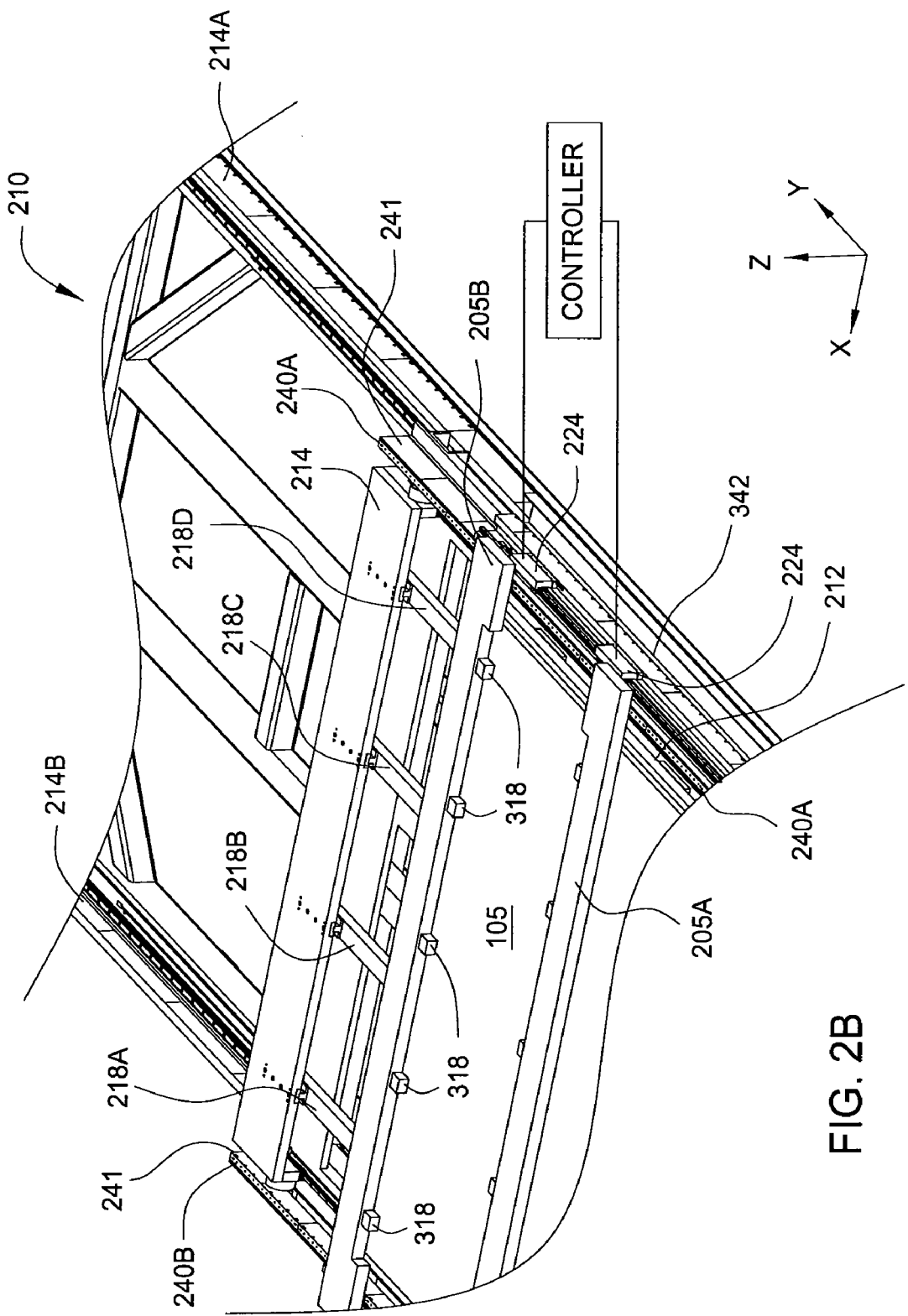
FIG. 2B is an isometric view of a portion of the testing table shown in FIG. 2A.

FIG. 2B is an isometric view of a portion of the testing table 210 shown in FIG. 2A. A substrate 105 is located on an upper stage 212 of the testing table 210. Probers 205A, 205B are shown on an upper surface of the prober support 240 above the substrate 105. The probers 205A, 205B are adapted to move along the length of the prober supports 240A, 240B by a plurality of drives 224 coupled between the prober supports 240A, 240B and opposing sides of each prober 205A, 205B. In one embodiment, the probers 205A, 205B include two drives 224 each (only one is shown in this view), both drives adapted to move along the prober support 240A, 240B. The drives 224 coupled to each prober 205A, 205B are synchronized and/or monitored to provide substantially equal motive force and/or a substantially equal travel rate to move the respective prober along the length of the prober support 240A, 240B. In another embodiment, the drives 224 provide vertical (Z direction) movement as well as horizontal (Y direction) movement to the respective prober 205A, 205B. In this embodiment, the probers 205A, 205B may be spaced apart from the upper surface of the prober supports 240A, 240B.

Each drive 224 may also be operated separately to enhance alignment between the substrate 105, between the displays (not shown) located on the substrate 105, and/or between the contact pads (not shown) located on the substrate 105, The drives may enhance alignment of the substrate 105, and/or displays and contact pads located thereon, relative to the probers 205A, 205B, and/or contact head assemblies 318 disposed on the probers 205A, 205B. The probers 205A, 205B are coupled to a controller that provides coordinate information to the drives 224. The controller also provides coordinate information to the individual contact head assemblies 318 to facilitate movement of the contact head assemblies 318. The controller is also electrically coupled to each prober 205A, 205B to provide signals to, or sense signals from, a plurality of prober pins (not shown) disposed on the contact head assemblies 318. Any wires or connectors between the controller and a power source (not shown) may be supported by a cable tray 342 that facilitates movement of the probers 205A, 205B along the length of the prober supports 240A, 240B and/or the testing table 210.

In one embodiment, the drives 224 enable the probers 205A, 205B to move between an idle position, a substrate transfer position, and a testing position along the length of the prober supports 240A, 240B and/or the testing table 210. As an example of a transfer position, probers 205A and 205B may be in any position along the prober supports 240A and 240B, and the Z directional movement of the drives 224 provide lift to the probers 205A, 205B to space the probers 205A, 205B away from the substrate 105 and/or the upper stage 212, which allows an unobstructed lifting and transfer of the substrate 105. In another example of a transfer position, probers 205A, 205B may be moved to an idle position at a distal end of the prober supports 240A, 240B. For example, the drives 224 coupled to probers 205A, 205B are actuated and one or both probers 205A, 205B travel to end 241 to place it away from the substrate 105. Once the probers 205A, 205B are spaced apart and/or away from the substrate 105, the end effector 214 may lift the substrate 105 from the upper stage 212 for transfer to the load lock chamber 120 (FIG. 2A) and a to-be-tested substrate may be transferred to the testing table 210.

Figure 3A:
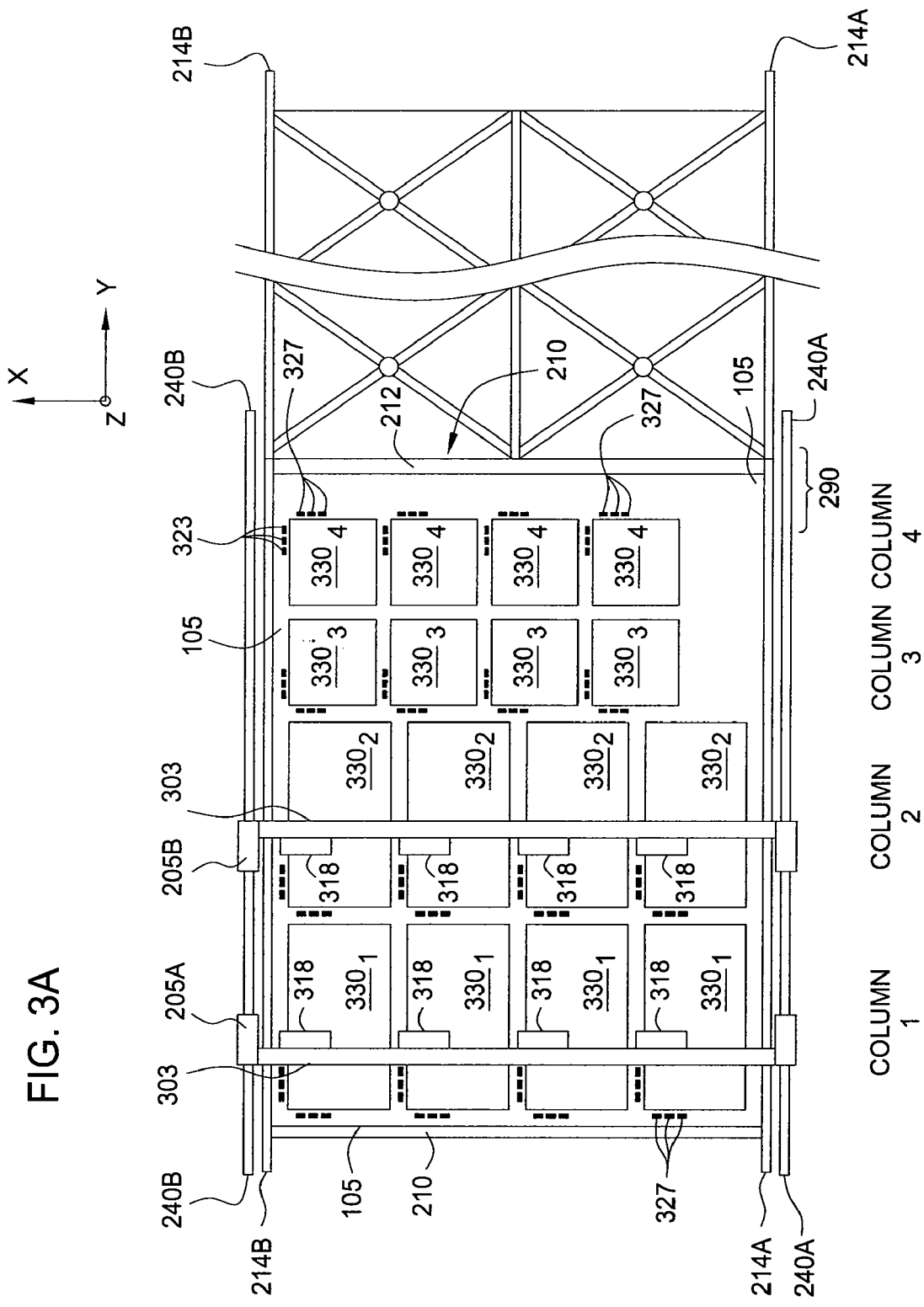
FIG. 3A is a sectional top view of one embodiment of a substrate and two probers above the substrate.

FIG. 3A is a sectional top view of one embodiment of a substrate 105 and two probers 205A, 205B supported above the substrate 105 by the prober support members 240A, 240B. The substrate 105 may be transferred and positioned on a testing table 210 housed in a testing chamber 110, or the substrate 105 may be transferred and positioned on any stage or testing table adapted to support the substrate 105 and move the substrate 105 linearly. In one application, the testing table 210 may be any stage or support capable of supporting a substrate 105 and moving the substrate 105 linearly. Additionally or alternatively, the testing table 210 may be stationary and the substrate 105 may be adapted to move relative to the testing table 210 in a linear direction. In some applications, the testing chamber 110 and/or load lock chamber 120 may be optional as the testing procedure may not require vacuum application.

The substrate 105 is generally rectangular and typically includes a large surface area for forming one or more flat panel devices or liquid crystal displays, shown in the Figure as displays $330_N$. Each display $330_N$ typically includes a plurality of conductive areas, such as contact pads 323 and/or 327 that are located adjacent to the outer perimeter of each display $330_N$. The contact pads 323, 327 may be a single conductive contact point, or may be a plurality of conductive contact points sometimes referred to as pad blocks, that are typically arranged parallel to an outer edge of the respective display $330_N$. Other examples of contact pads 323, 327 may be shorting bars that are located adjacent the perimeter of a display $330_N$.

The contact pads 323, 327 are generally in electrical communication with the electronic devices on an adjacent display $330_N$ and may be formed or located adjacent each display $330_N$. Each contact pad 323, 327 is configured to provide a coupling point for fine wire connections at final manufacturing, but may also be used to test the operability of each display $330_N$. For example, during testing of displays, the contact pads 323, 327 are adapted to be in selective electrical communication with a plurality of contact head assemblies 318 coupled to each prober 205A, 205B. The contact pads 323, 327 provide an interface for a plurality of prober pins 425 (FIGS. 4B-4C) disposed on the contact head assemblies 318, which apply or sense signals from the TFT's on the respective display $330_N$. The signals may be provided by, or sent to, a controller coupled to the probers 205A, 205B that is electrically coupled to each of the prober pins 425 by wires or cables. The contact pads may be provided substantially along the Y axis, and/or substantially along the X axis of the substrate 105, such as contact pads 323 and contact pads 327, respectively.

In one embodiment, each display $330_N$ includes a perimeter comprising four edges, and each contact pad 323, 327 is located adjacent and slightly outside of the perimeter of the display $330_N$. The contact pads 323, 327 may be substantially parallel to an edge or edges of the perimeter, or may be angled from the display edge or edges. For example, the contact pads may be a plurality of contact points in rows or columns, and the row/column may angle from the edge of the display $330_N$ in an application where the row/column of contact pads are not parallel with the edge of the display. While the contact pads 323, 327 are shown along top corners of the displays $330_N$, the contact pads may be disposed on any corner or side of the displays $330_N$.

In one embodiment, one or both of the probers 205A, 205B include a plurality of contact head assemblies 318 to simultaneously test all displays $330_N$ in a column of the substrate 105 width (X direction). For example, probers 205A or 205B may include four contact head assemblies 318 to contact the contact pads 327 adjacent displays $330_1$. In another example, probers 205A, 205B may include four contact head assemblies 318 adapted to contact the contact pads 323 adjacent displays $330_1$. In another example, probers 205A, 205B may include a plurality of contact head assemblies 318 adapted to contact all contact pads 323 and 327 in a column, for example contact pads 323 and 327 adjacent displays $330_1$. In this example, probers 205A, 205B may include eight contact head assemblies 318, or four contact head assemblies 318 having a shape configured to contact the contact pads 323 and 327. In other embodiments, the probers 205A, 205B include any number of contact head assemblies to contact a plurality of contact pads 323, 327 coupled to each display $330_N$ in a column of the substrate width (X direction). For example, each of the probers 205A, 205B may include 8 contact head assemblies 318 to test displays $330_N$ in a column. In another example, each of the probers 205A, 205B may include 6 contact head assemblies 318 to test displays $330_N$ in an arrangement where a column includes six displays $330_N$ and/or six contact pad locations.

The substrate 105 may include any number or configuration of product, which may be referred to as displays, and the product may include any corresponding contact pad configuration for a respective display. In this example, the substrate 105 includes eight 40 inch displays $330_1$, $330_2$ and eight 23 inch displays $330_3$, $330_4$. Each display $330_N$ may have contact pads 323, contact pads 327, or a combination of both. The probers 205A, 205B are adapted to test this product configuration and other product configurations by being adaptable to various display and/or contact pad configurations.

The substrate 105 may include any number and layout of displays $330_N$ configured to use the surface area of the substrate efficiently. For example, a manufacturer may produce multiple substrates 105 having various display and contact pad arrangements. As examples, the substrate 105 may include eight displays $330_N$ as shown, fifteen displays $330_N$, six displays $330_N$, eight displays $330_N$ of one size and eight displays $330_N$ of another size, or a plurality of displays $330_N$ of one size and a plurality of displays $330_N$ of one or more other sizes.

Regardless of the product configuration on the substrate 105, each of the displays $330_N$ may include contact pads 323, 327 adjacent each display $330_N$. The displays $330_N$ and/or contact pads 323, 327 may not be substantially aligned in the X and Y axis as shown in FIG. 3A with some substrates. Instead, the displays $330_N$ may be somewhat staggered in order to use the surface area of the substrate efficiently. An example may be illustrated in reference to FIG. 3A.

As shown, columns 1 and 2 (displays $330_1$ and $330_2$), may be substantially aligned relative to the X and Y axis, and have contact pads 323, 327 that are substantially aligned. However, the spacing and or alignment of columns 3 and 4 (displays $330_3$ and $330_4$), may not align with columns 1 and 2 relative to the Y direction. In order for the probers 205A, 205B to adapt to this varying alignment, the probers 205A, 205B include movable contact head assemblies 318 that provide movement at least along the length of the frame 303 to adjust to the alignment of various displays $330_N$. The movable contact head assemblies 318 also allow adjustment between substrates having different display and contact pad configurations. Embodiments described herein facilitate testing of a substrate or differing substrates by providing a prober having a plurality of contact head assemblies 318 to adapt the different configurations on the same or a different substrate. The adaptability of the probers 205A, 205B enables the testing chamber to remain in production by minimizing or eliminating prober transfer, which typically requires substantial venting and pump-down time of the testing chamber.

Each prober 205A, 205B generally includes at least a frame 303 that spans the area between the prober supports 240A, 240B. The frame 303 may be a unitary structure or a plurality of structural shapes coupled together by fasteners, bolts, screws, welds, or combinations thereof. In one embodiment, the frame comprises a structural shape in cross-section, and at least a portion of the frame may define a tubular longitudinal passage. The frame 303 may be made of lightweight materials, such as metals, rigid or semi-rigid plastics, or a combination thereof. In one embodiment, the frame 303 comprises an aluminum material.

Once the contact head assemblies 318 are electrically coupled to the displays $330_N$ through the contact pads 323, 327, a controller may be readied to provide signals to, or receive signals from, the electronic devices on the substrate 105. The testing table 210 may be actuated to move the upper stage 212 through a test zone 290 defined by the qualitative addressable area of the testing columns (not shown), which may be electron beam columns, charged particle emitters, charge sensing devices, optical devices, charge-coupled devices, cameras, and other devices that may be adapted to test the operability of the electronic devices on the substrate 105. The test zone 290 is configured to provide a qualitative addressable area above the substrate 105 that is sufficient to test the length or width of the substrate 105 as the substrate is moved through the test zone 290. In one embodiment, the test zone 290 comprises an area between about 1950 mm to about 2250 mm in the X direction and about 240 mm to about 290 mm in the Y direction. In another embodiment, the test zone 290 is between about 1920 mm to about 2320 mm in the X direction and about 325 mm to about 375 mm in the Y direction. Additional information on test areas provided by the testing columns may be found in U.S. Patent Publication No. 2006/0244467, previously incorporated by reference.

While the test operation has been described for testing four displays $330_N$ per column, any number of displays $330_N$ per column may be tested by adding additional contact head assemblies 318. Additionally, a greater number of contact head assemblies 318 may be coupled to each prober 205A, 205B and any contact head assembly 318 not needed for testing may be stored or parked along the length of the frame 303. In an example, each prober 205A, 205B may include six contact head assemblies 318 movable along the length of the frame 303, and in the case of testing four displays $330_N$ per column, two contact head assemblies 318 may be parked along the frame 303 so as not to interfere with testing. Six contact head assemblies 318 allows testing of up to six displays $330_N$ per column or less by storing or parking the contact head assemblies that are not needed. In the case of testing four displays $330_N$ per column, the contact head assemblies that may not be needed for a test sequence may be parked outside of the area of the displays $330_N$ to be tested. For example, the un-used contact head assemblies 318 may be positioned outside of the perimeter of the displays $330_N$ in the column. This position may be along the edge of the substrate 105 or any position wherein the contact head assemblies 318 do not obstruct the addressable area of the displays $330_N$ in the column.

In one embodiment, the probers 205A, 205B are configurable and adaptable to different substrate display and contact pad arrangements by having contact head assemblies 318 that are movable. For example, the prober 205A and/or prober 205B may be configured to test a first substrate, such as first substrate 105 as shown in FIG. 3A. Once the first substrate 105 has been tested, the manufacturer may queue one or more substrates that have a substantially similar display and contact pad configuration as the first substrate 105. In this case, the prober 205A and/or prober 205B may remain in the testing chamber 110 during testing of each substrate similar to the first substrate 105 without reconfiguration. The probers 205A, 205B may require minor adjustments to adapt to the alignment of the to-be-tested substrate, but the pitch of the contact head assemblies may remain substantially the same.

However, after testing of one or more substrates that have similar display and contact pad configurations to the first substrate 105, the manufacturer may queue another substrate having a different display and contact pad configuration that is different from the layout of the first substrate 105. In this case, the contact head assemblies 318 may be configured for the to-be-tested substrate while the chamber is under vacuum by signals from the controller to the individual contact head assemblies 318. The probers 205A and/or 205B may remain in the testing chamber 110, thus negating venting, opening of the testing chamber 110 to the clean room environment, and pump-down time.

Figure 3B:
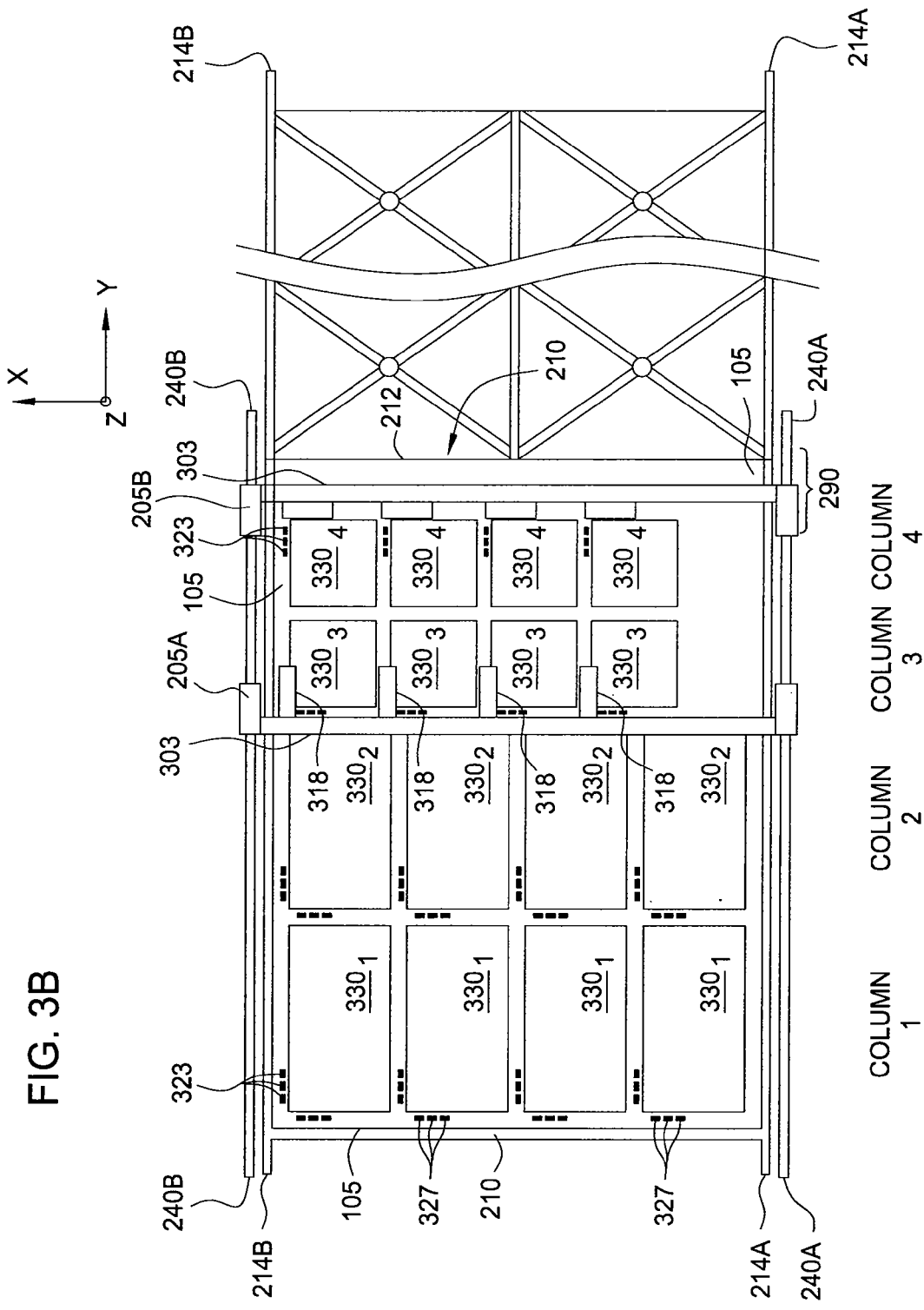
FIG. 3B is a sectional top view of one embodiment of test positions of the probers of FIG. 3A.

FIG. 3B is a sectional top view of one embodiment of test positions of the probers 205A, 205B. As shown, prober 205B is in a test position for testing displays $330_4$ in column 4 while the prober 205A is in a test position for testing displays $330_3$ in column 3. In order to test the displays $330_4$ in column 4, the contact pads 327 and the prober pins (FIGS. 4B-4C) on the contact heads 318 of prober 205B are brought into contact with each other. This contact may be provided by vertical (Z direction) movement of one or both of the upper stage 212 of the testing table 210 and the contact heads 318. In one embodiment, the substrate 105, supported on an upper surface of the upper stage 212, is moved vertically (Z direction) to facilitate contact between the prober pins coupled to prober 205B and the contact pads 327.

In this example, the prober 205B may be readied for testing by actuating the drives 224 coupled to the prober 205B in the Y direction to a position adjacent column 4 (displays $330_4$). Prober 205A may likewise be positioned adjacent column 3 (displays $330_3$). When the probers 205A, 205B are adjacent columns 3 and 4, respectively, the drives 224 coupled to each prober 205A, 205B may be stopped. Any alignment corrections between the probers 205A, 205B and the substrate 105, or displays $330_{3-4}$, may be corrected by actuating the drives 224 as needed. The prober 205B may be positioned adjacent column 4 where no portion of the prober 205B covers the displays $330_4$, which may interfere with testing of the displays $330_4$ as the substrate 105 passes through the test zone 290. When in position, the contact head assemblies 318 on probers 205A, 205B may be moved laterally (X direction) on the respective frame 303 to facilitate alignment and positioning of the contact heads of the contact head assemblies 318 relative to the contact pads 323 and/or 327 on the substrate 105. The contact heads of the contact head assemblies 318 may be further actuated to a position parallel to the frame 303 as shown in reference to prober 205B, or to a position orthogonal to the frame 303 as shown in reference to prober 205A. Once the contact heads of the contact head assemblies 318 are in position, the contact pads 323, 327 are brought into contact with the prober pins on the contact heads of the contact head assemblies 318, and a testing sequence may begin by moving the testing table 210 and substrate 105 horizontally (Y direction) through the test zone 290.

Figure 3C:
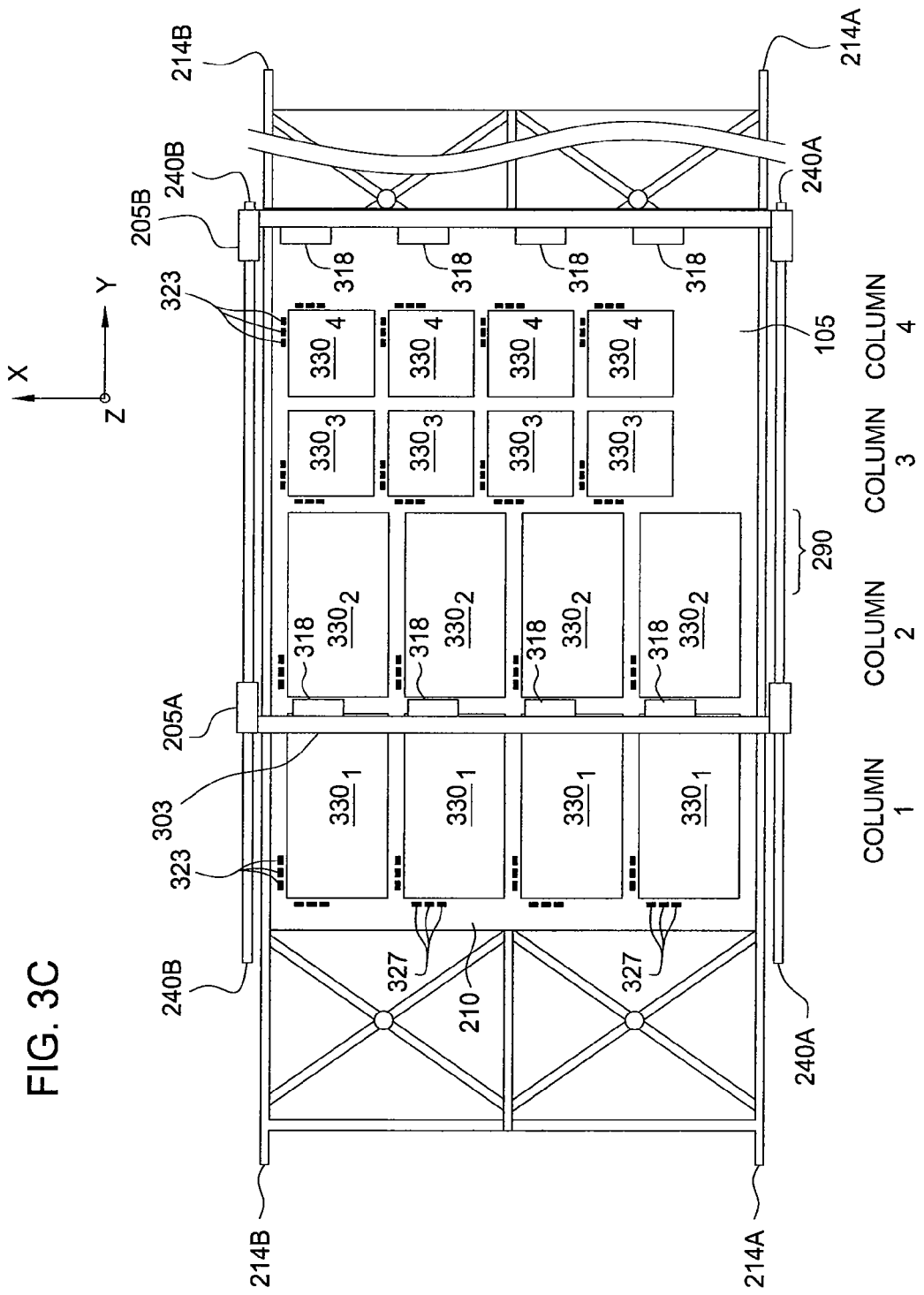
FIG. 3C is a sectional top view of another embodiment of a test position of a prober shown in FIG. 3A.

FIG. 3C is a sectional top view of another embodiment of a test position of prober 205A. As shown, displays $330_{3-4}$ located on columns 3 and 4 have traveled through the test zone 290 and displays $330_{1-2}$ located on columns 1 and 2 are ready to pass through the test zone 290. Although not shown, prober 205B may be used to test the displays $330_N$ located on one or both of columns 1 and 2, but in this example, the prober 205B may not be used to test displays $330_{1-2}$ located on columns 1 and 2. In this example, prober 205B may be positioned outside of the test zone 290 so as to not interfere with subsequent testing.

To ready the displays $330_2$ of column 2 for testing, the contact heads 318 of prober 205A are positioned over the contact pads 327. Although not shown, the contact heads 318 may be positioned over the contact pads 323, or prober 205A may be positioned and configured to allow contact between the contact heads 318 and a combination of contact pads 323 and 327. In order to test the displays $330_2$ in column 2, the contact pads 323 and the prober pins on the contact heads 318 of prober 205B are brought into contact with each other. This contact may be provided by vertical (Z direction) movement of one or both of the upper stage 212 of the testing table 210 and the contact heads 318. In one embodiment, the substrate 105, supported on an upper surface of the upper stage 212, is moved vertically (Z direction) to facilitate contact between the prober pins coupled to prober 205A and the contact pads 323. Once electrical communication is established between the contact pads 323 and the prober pins coupled to the prober 205A via the contact heads 318, the substrate 105 may be moved through the test zone 290 below the plurality of testing columns (not shown). Displays $330_1$ of column 1 may be readied for testing similarly as described above and is not shown for the sake of brevity.

After testing all displays $330_N$, the substrate 105 may be transferred from the testing chamber 110 to the load lock chamber 120. A substrate having a different display and/or contact pad pattern may be queued for testing and transferred to the testing chamber 110. During transfer of the substrate, or before testing, one or both of the prober assemblies may be readied for testing while the testing chamber 110 is under vacuum.

Figure 4A:
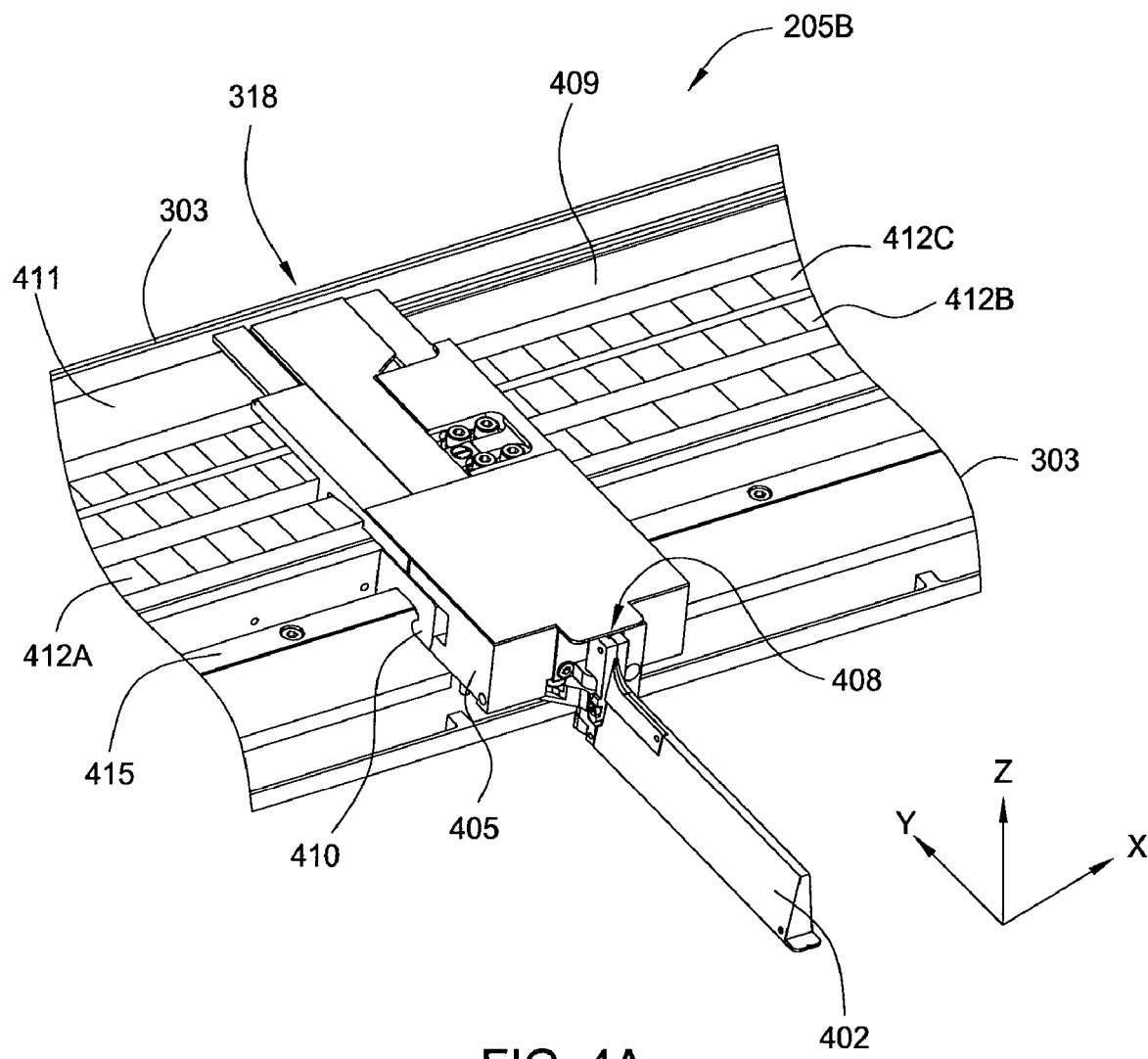
FIG. 4A is an isometric view of one embodiment of a contact head assembly.

FIG. 4A is an isometric view of one embodiment of a contact head assembly 318 coupled to the frame 303 of a prober 205B. The contact head assembly 318 includes a housing 405 that is movable relative to the frame 303 and the housing 405 includes a contact head 402 that is movable relative to the housing 405. The contact head 402 includes a plurality of prober pins (not shown) for contacting the plurality of contact pads 323 and/or 327 on the substrate 105 and the contact head 402 is movably coupled to the housing 405 at a pivot point 408. The housing 405 is also coupled to a carriage 410 that moves the housing 405 linearly across an interface 415 that is part of the frame 303. The interface 415 may be a guide for the contact head assembly 318 as it moves laterally across the frame 303, and may also comprise a ceramic strip and/or an encoder tape.

To facilitate lateral movement of the contact head assembly 318, the contact head assembly 318 is coupled to a belt 412A that is coupled to an actuator (not shown in this view) which is coupled to the frame 303. Other belts 412B, 412C are also shown that are coupled to other contact head assemblies 318 that are not shown in this view. The belt 412A coupled to the contact head assembly 318 moves in the X direction to move the housing 405 relative to the frame 303. The frame also includes a cable tray 409 to support a cable 411 that is coupled to the contact head 402 through the housing 405. The cable 411 may be a ribbon cable that includes fine wire connections to each of the prober pins (not shown) disposed on the contact head 402, and may also include other electrical connections used on the prober 205B.

Figure 4B:
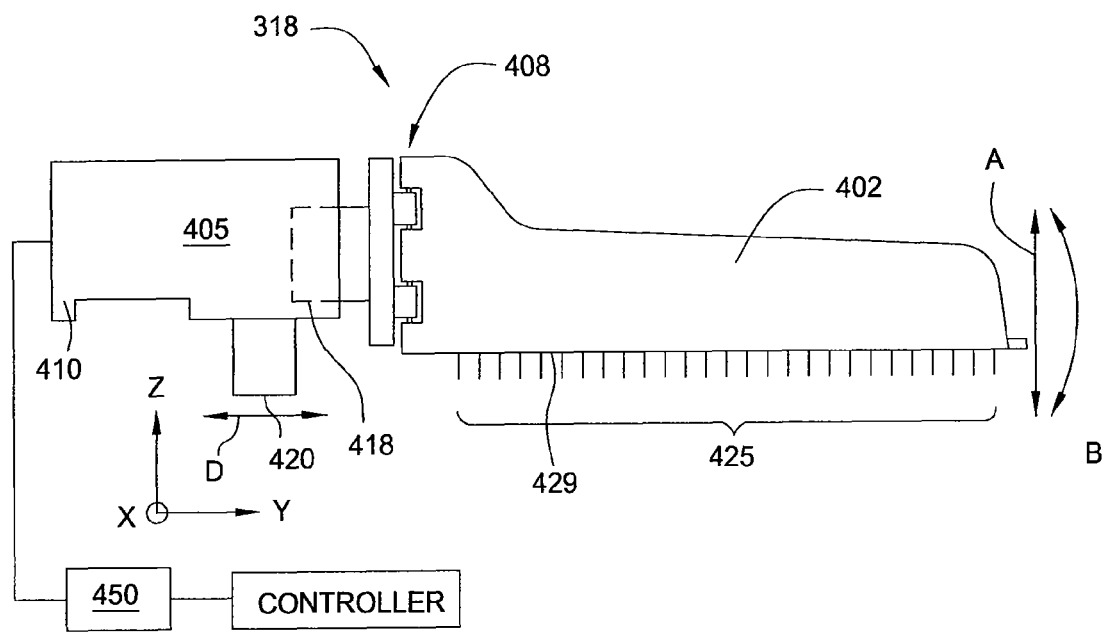
FIG. 4B is schematic side view of one embodiment of a contact head assembly.

FIG. 4B is schematic side view of one embodiment of a contact head assembly 318. The contact head 402 includes a body having a lower surface 429 that includes a plurality of prober pins 425. The plurality of prober pins may be one or more pogo pins, one or more needle probes, and combinations thereof. The plurality of prober pins 425 are adapted to contact the plurality of contact pads 323, 327 located on the substrate 105 (FIGS. 3A-3C) to test the operability of electronic devices located on the substrate.

Each of the prober pins 425 are adapted to provide a signal or signals from the controller to the devices on respective displays $330_N$, or sense a signal or signals from respective displays $330_N$, and provide the signal(s) to the controller. In one embodiment, the prober pins 425 are selectively electrically coupled together to the controller to enable one signal to be communicated to or from each of the plurality of prober pins 425. In another embodiment, each of the plurality of prober pins 425 may be selectively electrically coupled to the controller independently, wherein a plurality of signals are communicated separately to or from the plurality of prober pins 425. The selective coupling and decoupling may be provided by input from the controller. The prober pins 425 may also be configured to discharge static electricity as well as selectively send and receive one or more signals.

In one embodiment, each of the prober pins 425 may be connected by a patch board assembly 450 to a pattern generator output that is in communication with a controller. Individual patch boards may be used to control the output to prober pin assignment and each patch board may be configured for a particular display type. Thus, testing of different display types may involve selecting a particular patch board configured for the display to be tested.

The contact head assembly 318 also includes a movable member 420 extending from a lower surface of the housing 405 which facilitates movement of the contact head 402 relative to the housing 405 and the frame 303 (FIG. 4A). In one embodiment, the movable member 420 is coupled to the contact head 402 and facilitates rotational movement of the contact head 402 relative to the frame 303. The movable member 420 may be movable at least in the direction of arrow D in response to a force provided, at least in part, by contact with a biasing member disposed within the housing 405, as will be described in reference to FIGS. 6 and 7A-7H.

In one embodiment, the contact head 402 may be movable relative to the housing 405 as described above in reference to FIG. 4A, and the contact head 402 may also be vertically and/or rotationally movable relative to the housing 405. In one aspect, the contact head 402 is coupled to the housing 405 by a motor 418 (shown in phantom). The motor 418 provides at least vertical movement in the direction of arrow A, but may also be capable of moving the contact head 402 in an angular orientation relative to the housing 405. The vertical movement of the contact head 402 may be used to provide contact between the contact pads 323, 327 located on the substrate 105 (FIGS. 3A-3C) and the angular movement may provide enhanced alignment of the contact head 402 relative to the substrate 105 and/or the contact pads 323, 327. The angular movement of the contact head 402 relative the housing 405 may be rotational movement or radial movement at the pivot point 408 to provide an angle of incidence relative to the housing 405 and/or the frame 303 (FIG. 4A). Alternatively or additionally, the angular movement of the contact head 402 relative to the housing 405 may be in the direction indicated by arrow B, which may enhance alignment of the contact head 402 relative to the horizontal plane of the substrate 105.

Figure 4C:
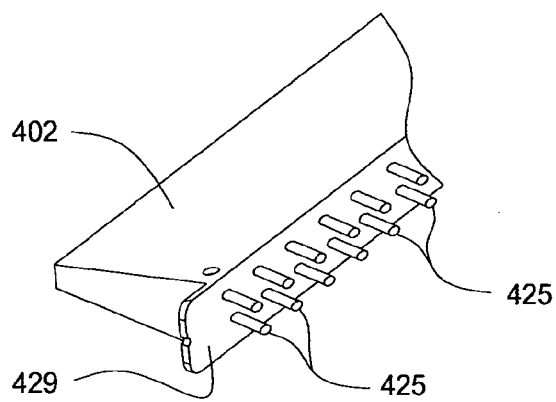
FIG. 4C is an isometric view of the contact head of FIG. 4B.

FIG. 4C is an isometric view of the contact head 402 of FIG. 4B. The contact head 402 includes a lower surface 429 having one or more rows of prober pins 425. The prober pins 425 may be arranged in rows as shown, or the prober pins 425 may be arranged in any suitable pattern on the lower surface 429. Individual prober pins 425 may be selected or entire rows may be selected to provide or sense signals from the contact pads 323, 327 (FIGS. 3A-3C). Alternatively, the lower surface 429 may include only one row of prober pins 425.

Figure 5A:
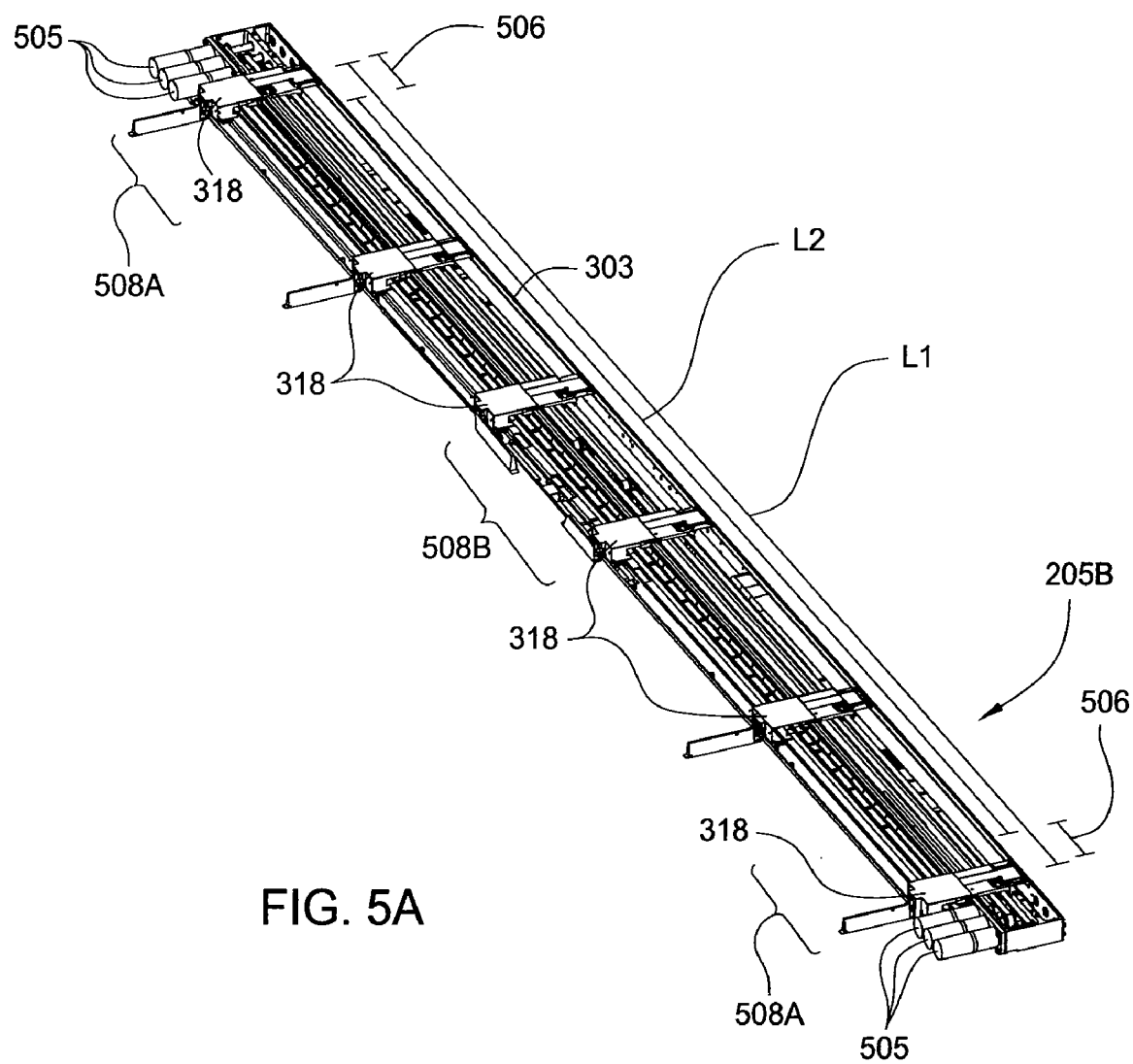
FIG. 5A is an isometric view of another embodiment of a prober.

FIG. 5A is an isometric view of another embodiment of a prober 205B. The prober 205B includes a frame 303 and six contact head assemblies 318. The prober 205B also includes a plurality of motors 505 disposed on the frame 303 that are coupled to the contact head assemblies 318 by belts. The frame 303 also includes a plurality of stepped portions 508A-508B that facilitate switching of the orientation of the contact heads of the contact head assemblies 318 to and from a parallel position relative to the frame 303 and a perpendicular position relative to the frame 303. The frame 303 includes a length $L_1$ that defines the travel range of the plurality of contact head assemblies 318 along the frame 303. The frame also includes a length $L_2$ that may equal or be slightly less than a length or width of a large area substrate (not shown). In one embodiment, the area 506, which may be the difference of length $L_1$, and length $L_2$, defines a contact head assembly 318 storage area. In this embodiment, each of the contact head assemblies 318 may be positioned outside of the length or width of the substrate in areas 506 so as not to interfere with testing or transfer of the substrate.

Figure 5B:
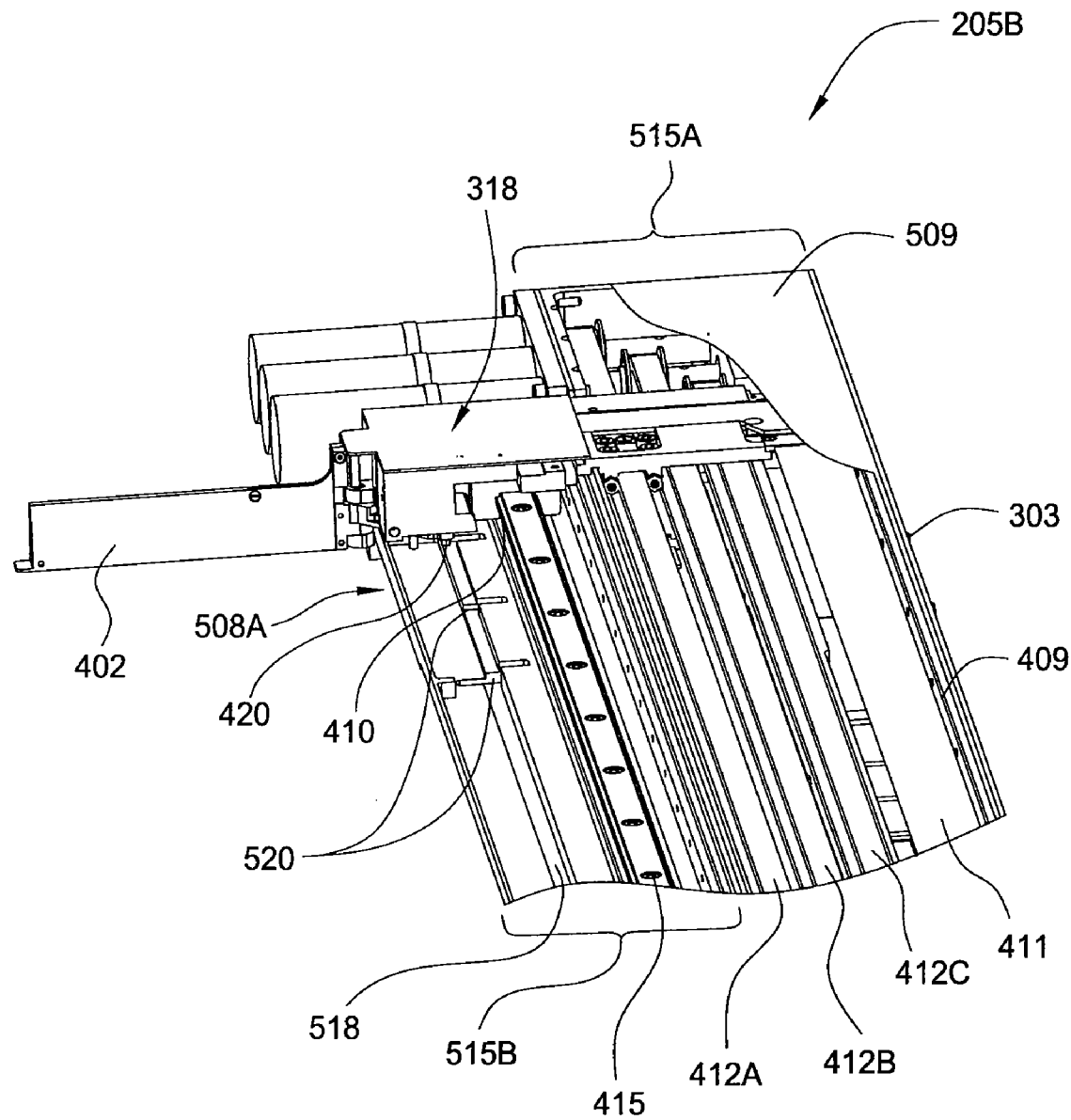
FIG. 5B is an isometric sectional view of another embodiment of a prober.

FIG. 5B is an isometric sectional view of another embodiment of a prober 205B. The prober 205B includes a frame 303 having a first portion 515A and a second portion 515B. The first portion 515A includes belts 412A-412C and cable tray 409, and the second portion 515B includes a contact head assembly travel portion, which includes interface 415 and stepped portions 508A-508B (only 508A is shown in this view). The first portion 515A may also include a cover 509 housing the cable tray 409 and the belts 412A-412C.

The second portion 515B also includes a channel 518 along the length $L_1$ (FIG. 5A). The channel 518 is configured to provide a path for the movable member 420 coupled to the contact head assembly 318. The channel 518 is coupled to stepped portions 508A and 508B and facilitates contact between the movable member 420 and a plurality of stops 520 within the stepped portion 508A. As will be described below, each stop 520 is adapted to extend above the plane of the channel 518 to facilitate switching of the orientation of the contact heads 402.

Figure 6:
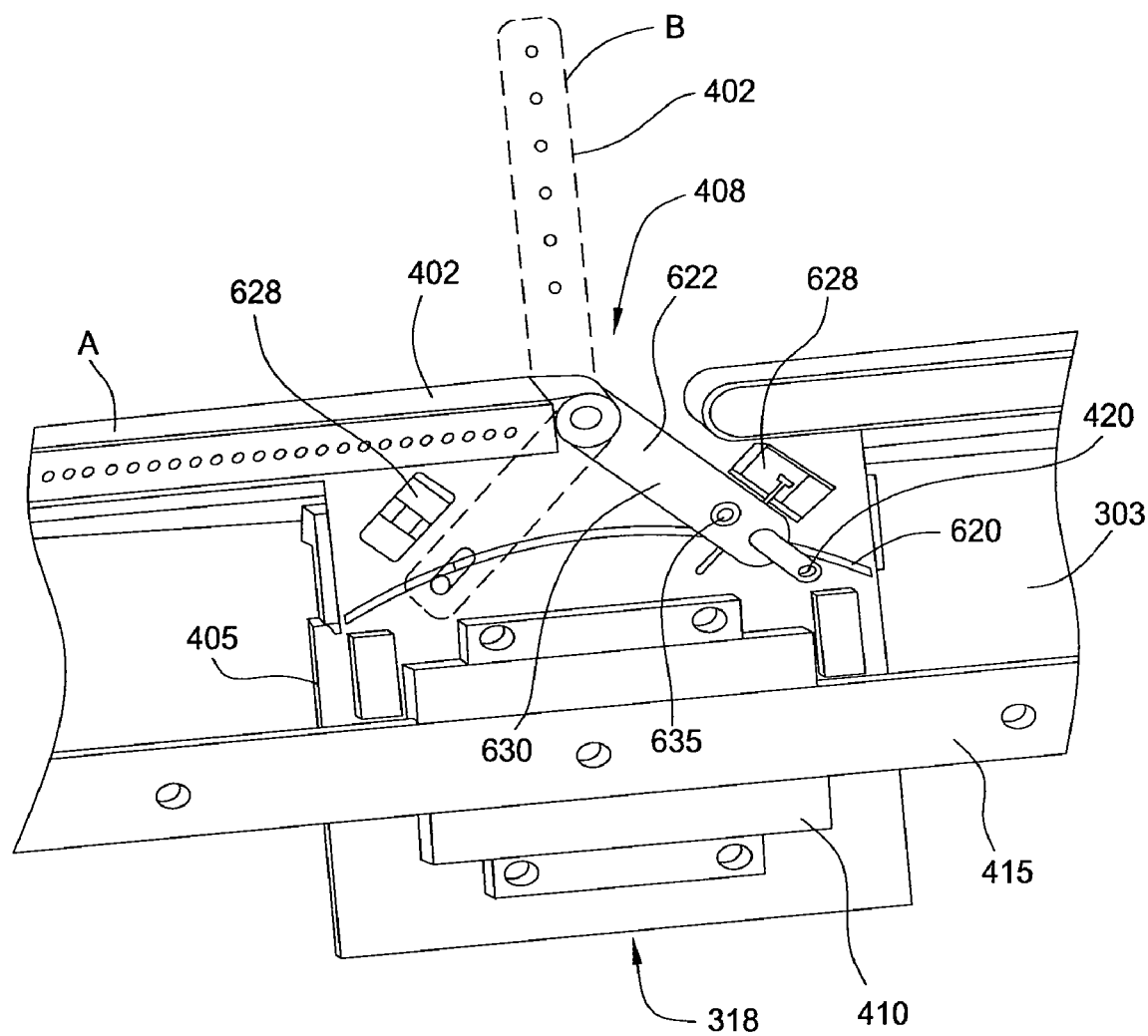
FIG. 6 is an isometric view of a lower portion of a contact head assembly.

FIG. 6 is an isometric view of a lower portion of a contact head assembly 318. The contact head assembly 318 includes a contact head 402 statically coupled to a switching extension 622 that is rotatable at a pivot point 408. The switching extension 622 includes a movable member 420 as shown in FIG. 4B that is adapted to contact one or more stops 520 shown in FIG. 5B and at other stops along the length of the frame 303. The contact head 402 may be selectively switched back and forth from a position "A" that is substantially parallel to the frame 303 and a position "B" (shown in phantom) that is substantially perpendicular to the frame 303. The positions "A" and "B" may be monitored by contact of the switching extension 622 with a sensor 628.

The switching extension 622 includes a lower side 630 having the movable member 420 extending therefrom. The switching extension 622 also includes a pin 635, a portion of which is shown in FIG. 6A, that extends from an upper side opposite the lower side 630. The pin 635 is adapted to contact a biasing member 620 as the housing 405 is moved along the length of the frame 303. The pin 635 is also adapted to facilitate switching of the contact head 402 when the movable member 420 contacts a stop 520.

FIGS. 7A-7H are schematic views of various embodiments of contact head positioning on probers 205A, 205B. The contact head 402 is coupled to a switching extension 622 having a pin 630 extending therefrom and contacting a biasing member 620, which may be a spring or other device adapted to provide tension. The frame 303 is also shown schematically, which includes a plurality of stops 520. The stops 520 may be placed at any desired position along the length of the frame 303. Although not shown in this view for clarity, the switching extension 622 includes a movable member 420 (FIGS. 4B, 5B, and 6) that is adapted to contact the stop 520, but in the schematic nature of the Figures and for clarity, the pin 630 will be shown contacting the stops 520 to demonstrate the switching conceptually. In one embodiment, the stops 520 are positioned at or near the center of the length of the frame 303, and at positions away from the center, such as opposing ends of the frame 303.

Figure 7A:
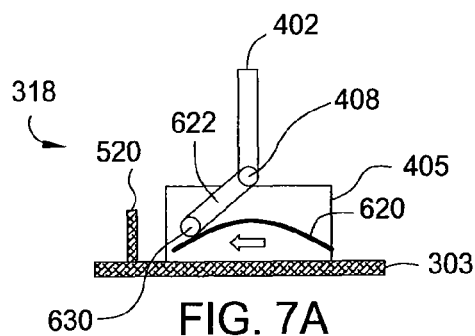
FIGS. 7A-7H are schematic views of various embodiments of contact head positioning.
Figure 7E:
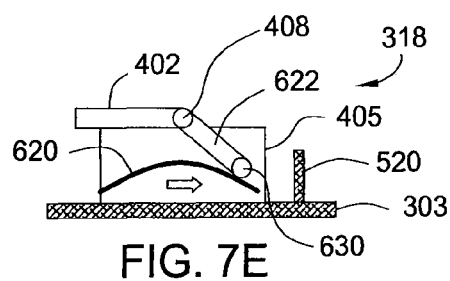
Figure 7B:
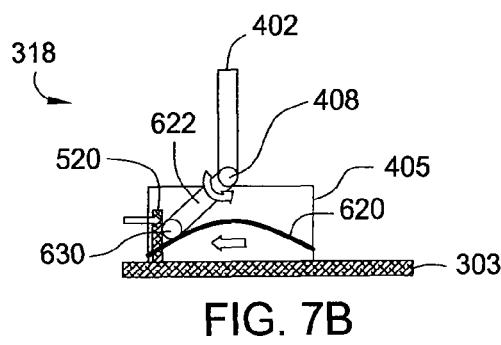

The housing 405 is adapted to move in the X direction along the frame 303 by a belt (FIGS. 4A and 5B) and the contact head 402 is adapted to rotate at the pivot point 408 between a position parallel to the frame 303, or a position orthogonal or cantilevered to the frame 303. The X directional movement is adapted to change the orientation of the contact head 402 by moving the contact head 402 from a cantilevered position to a parallel position, and vice versa. The changing of the directional orientation of the contact head 402 may be provided under vacuum within the testing chamber, thereby minimizing vent and/or pump-down time for prober setup. For example, in order to move the contact head 502 from a cantilevered position as shown in FIG. 7A, housing 405 is actuated in the X direction so the end of the extended member 522, specifically the movable member 420 (FIGS. 4B, 5B, and 6) contacts the stop 520 as shown in FIG. 7B. The pin 630 is also in communication with the biasing member 620 to facilitate movement of the contact head 402.

The X directional movement of the housing 405 is continued until the biasing member 622 is compressed by the pin 630. The X directional movement continues until the contact head 402 has been reoriented to a point where the biasing member 620 may rebound and the contact head 402 is urged to a parallel position by the biasing member 620 as shown in FIG. 7D.

Figure 7F:
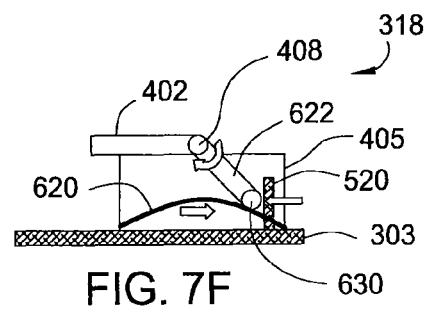
Figure 7C:
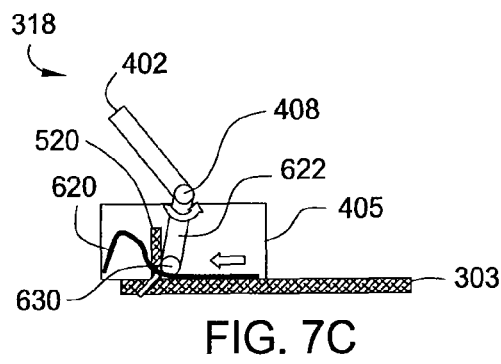
Figure 7G:
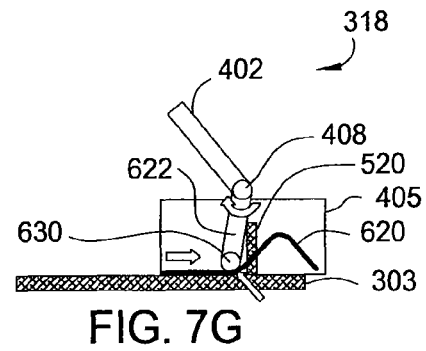
Figure 7D:
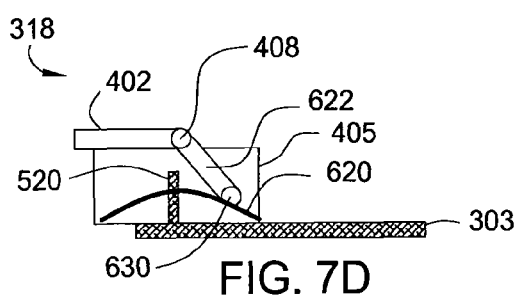
Figure 7H:
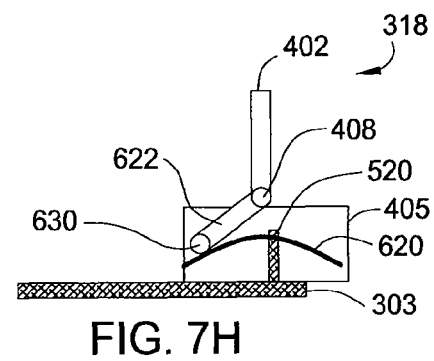

In order to reverse the positioning of the contact head 402, the housing 405 is actuated in the X direction against the stop 520 as shown in FIG. 7F. The X directional actuation continues until the biasing member 620 is at least partially compressed by the pin 630, as shown in FIG. 7G. The actuation continues until the contact head 402 has been reoriented to a point where the biasing member 620 may rebound and the contact head 402 is urged to a cantilevered position by the biasing member 620 as shown in FIG. 7H.

Figure 8A:
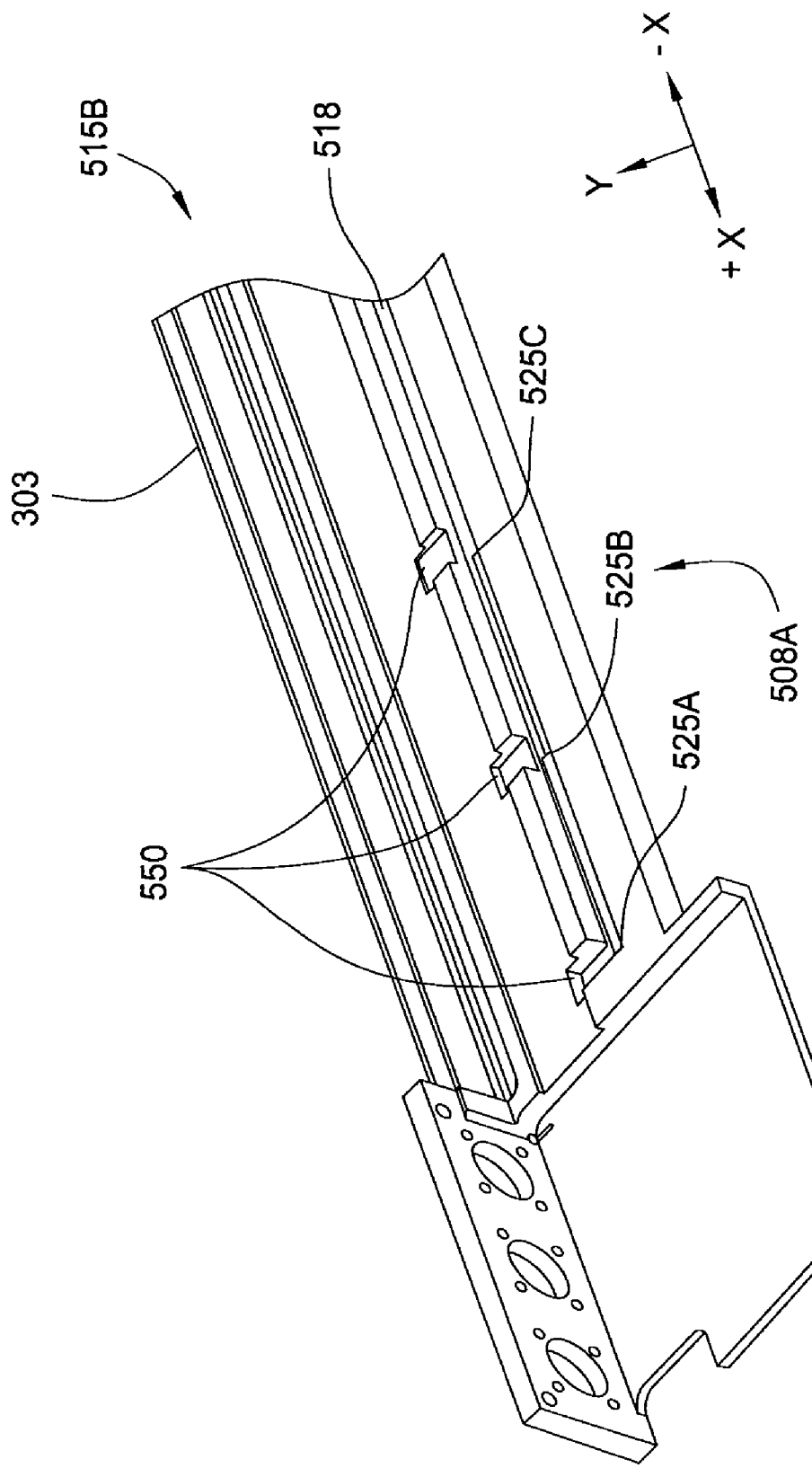
FIG. 8A is an isometric view of a portion of the frame shown in FIG. 5B.

FIG. 8A is an isometric view of a portion of the frame 303 shown in FIG. 5B. The stepped portion 508A of frame 303 is shown having three stops 525A-525C that extend above the plane of the channel 518. The stops 525A-525C facilitate switching of the contact heads (not shown in this view) by providing a hard stop for the movable members 420 (FIGS. 4B, 5B, and 6). Each stop 525A-525C is raised to a different height above the channel 518 to facilitate contact with some movable members 420 on specific contact head assemblies 318 while allowing other movable members 420 on other contact head assemblies to pass by without contact with a movable member 420.

Referring again to FIG. 5A, the frame 303 may include six contact head assemblies 318 as shown in FIG. 5A and three of the contact head assemblies 318 may be movable along one half of the length $L_2$. In one embodiment, the contact heads may be parked in a cantilevered position at portion 506 and be switched to a parallel orientation at stepped portion 508B. When the contact heads are switched, the contact head assemblies are movable relative to the frame 303 in the parallel orientation until the contact head assembly 318 is actuated toward the stepped portions 508A. For example, referring to FIG. 8A, the outermost or first contact head assembly 318 (not shown in this view) may be moving in a parallel orientation along the frame 303 in the +X direction approaching stepped portion 508A. The movable member 420 (FIGS. 4B, 5B, and 6) of the outermost contact head assembly 318 is adapted to pass over or by stops 525B and 525C. However, stop 525A is of a height to contact movable member 420 of the outermost contact head assembly 318 to facilitate switching of the contact head from a parallel orientation to a cantilevered or orthogonal orientation when the housing of the contact head assembly 318 is continually urged in the +X direction as described in reference to FIGS. 7E-7H.

Likewise, the second (middle) and third (innermost) contact head assemblies 318 may move in the +X direction having contact heads in a parallel orientation and be selectively switched to a cantilevered orientation at stepped portion 508A. The movable member 420 of the second contact head assembly 318 is adapted to pass over or by stop 525C and contact stop 525B to facilitate switching by continual urging in the +X direction, and the movable member 420 of the third contact head assembly 318 is adapted to contact stop 525C to facilitate switching by continual urging in the +X direction. It is to be noted that the frame 303 is substantially symmetrical with respect to the stepped portions 508A and while not shown in this Figure, the frame 303 includes two stepped portions 508A at opposing ends, and the contact heads on the three contact head assemblies 318 disposed on the opposing half of the frame 303 may be switched by actuation of the housings 405 in the −X direction as shown in this Figure. The opposing stepped portion 508A also includes stops in a symmetrical nature adapted to provide a switching point for an outermost, middle, and innermost contact head assembly 318 disposed on the opposing half of the frame 303. Each of the stops 525A-525C also include a cutout area 550 adapted to allow ample area for the movable member 420 as it is facilitates rotation and switching of the orientation of the contact head.

Figure 8B:
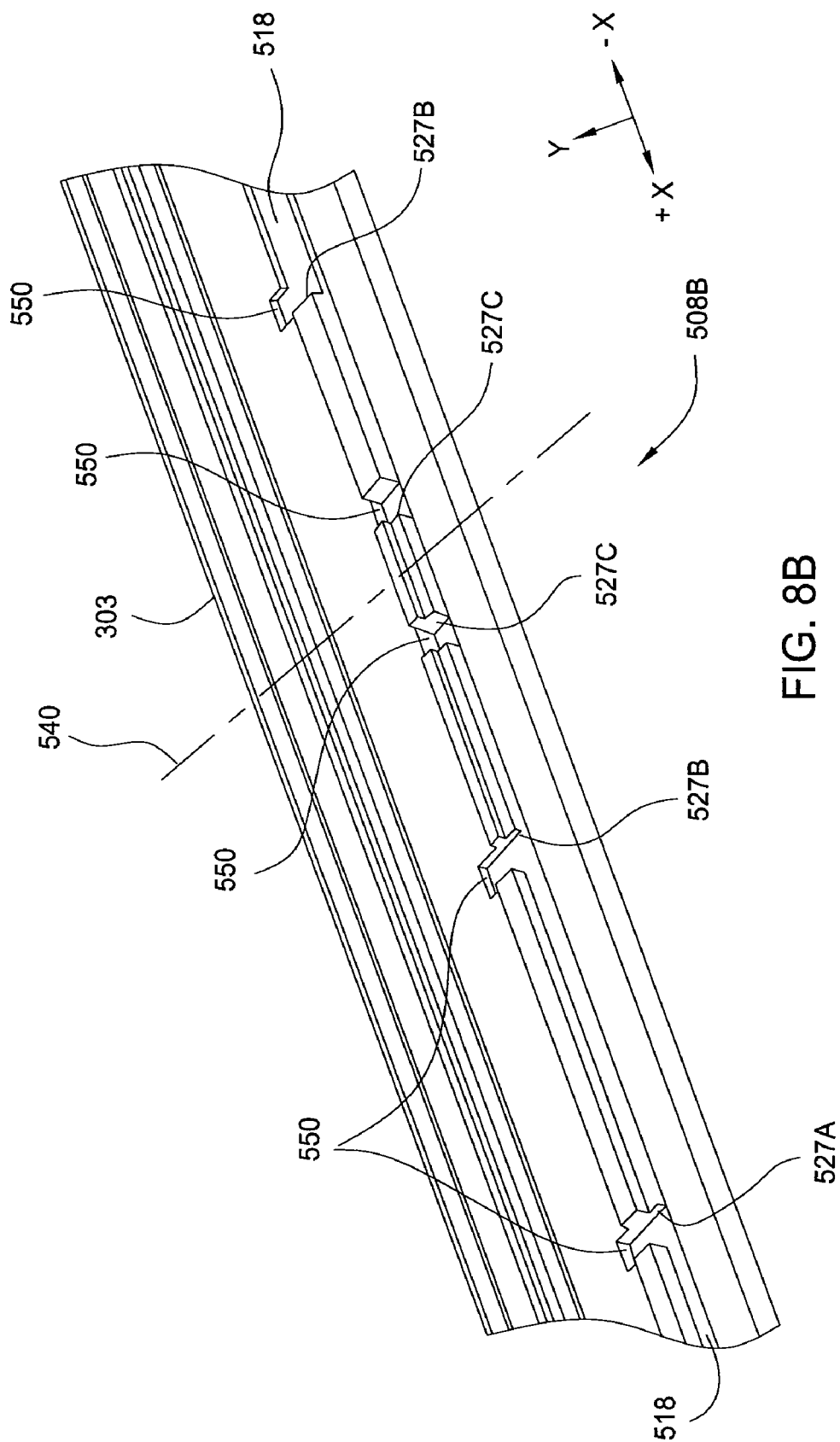
FIG. 8B is an isometric view of another portion of the frame shown in FIG. 5B.

FIG. 8B is an isometric view of a portion of the frame 303 shown in FIG. 5B. The frame 303 includes a centerline 540 that defines the halves of the frame 303. In the case of six contact head assemblies 318, three contact head assemblies 318 would be disposed on the frame 303 to the left of the centerline 540, and three contact head assemblies 318 would be disposed on the right side of the centerline 540. The frame 303 also includes a stepped portion 508B adapted to facilitate switching the orientation of the contact heads disposed on contact head assemblies 318.

When the contact heads of contact head assemblies have been switched to the orthogonal orientation as described above in reference to FIG. 8A, the contact head assemblies 318 may be moved in the −X direction or +X direction toward the stepped portion 508B, depending on which side of the centerline 540 the contact head assemblies 318 are disposed on. As described in FIG. 8A, stop 527C may be the same height as stop 525A and is adapted to provide a stop for the innermost contact head assembly 318 to facilitate switching the contact head to a parallel orientation. The movable member 420 is adapted to pass over or by the stops 527A, 527B to allow travel of the contact head to stop 527C. Stops 527A and 527B are configured similarly to stops 525A and 525B, respectively, to provide stops for the middle and outermost contact head assemblies 318, respectively. Continued movement of the housings and the contact head assemblies 318 in the X (+X or −X depending on the half the contact head assemblies are disposed on) direction urges the contact heads to change from an orthogonal orientation to a parallel orientation as described in reference to FIGS. 7A-7D.

Embodiments described herein provide loading of at least two probers for use in testing operations in the testing chamber 110 while the testing chamber is open to the clean room environment, which is typically at or near atmospheric pressure. The various embodiments described herein increase throughput by minimizing venting and pump down time by providing the at least two probers to the testing chamber 110 for storage and/or use in testing operations. The probers may be configured remotely for different substrate display and/or contact pad arrangements while the testing chamber 110 is under vacuum.

While the foregoing is directed to embodiments of the present invention, other and further embodiments of the invention may be devised without departing from the basic scope thereof, and the scope thereof is determined by the claims that follow.

The invention claimed is:

1. A prober assembly for contacting electronic devices on a substrate, comprising:
   a frame having a length greater than a width of a substrate; and
   a plurality of contact head assemblies movably coupled along the length of the frame, each of the contact head assemblies comprising a contact head and a switching mechanism to facilitate independent pivotable movement of the respective contact head relative to the frame, wherein the frame includes a plurality of motors and at least one of the plurality of motors is connected to at least one of the plurality of contact head assemblies by a belt.

2. The apparatus of claim 1, wherein each contact head includes a plurality of prober pins coupled to a lower surface thereof.

3. The apparatus of claim 1, wherein the frame comprises a tubular member having at least two motors of the plurality of motors disposed at opposing ends of the tubular member, the at least two motors operably coupled to a support member disposed on a testing system to move the frame relative to the support member.

4. The apparatus of claim 1, wherein each contact head is oriented in a parallel direction relative to the frame and is movable while oriented in the parallel direction relative to the frame by the at least one motor.

5. The apparatus of claim 1, wherein each contact head is oriented in an orthogonal direction relative to the frame and is movable while oriented in the orthogonal direction relative to the frame by the at least one motor.

6. The apparatus of claim 1, wherein the frame comprises a guide bar and each contact head assembly comprises a housing having a carriage assembly movably coupled to the guide bar.

7. The apparatus of claim 1, wherein the switching mechanism comprises a pivoting portion coupled to a biasing member to switch the orientation of the contact head relative to the frame.

8. A prober assembly, comprising:
a frame; and
a plurality of contact head assemblies movably coupled to and independently movable along a length of the frame, each contact head assembly comprising:
a housing; and
a movable contact head having a plurality of prober pins disposed on a lower surface thereof, the contact head being coupled to a switching mechanism providing pivotable movement of the contact head about an axis relative to the housing, the pivotable movement being independent of other contact heads, wherein each contact head is coupled to at least one motor by a belt.

9. The apparatus of claim 8, wherein each contact head is independently pivotable in a position in which the contact head is aligned parallel to the length of the frame and a position in which the contact head is aligned orthogonal to the length of the frame.

10. The apparatus of claim 8, wherein the frame includes at least six contact head assemblies.

11. The prober assembly of claim 8, wherein the frame comprises a guide bar and the housing comprises a carriage assembly movably coupled to the guide bar.

12. The prober assembly of claim 8, wherein the frame comprises at least one channel disposed in a longitudinal direction along the frame.

13. The prober assembly of claim 12, wherein the switching mechanism comprises a pin that is received by the channel.

14. The prober assembly of claim 13, wherein the channel comprises a plurality of stops adapted to receive the pin and facilitate pivotal movement of the contact head relative to the housing.

15. A prober assembly for contacting electronic devices on a substrate, comprising:
a frame having a length greater than a width of a substrate; and
a plurality of contact head assemblies movably coupled along the length of the frame, each of the contact head assemblies being independently pivotable relative to the frame, wherein each contact head assembly includes a contact head coupled to a pin and the frame includes at least one stepped portion having a plurality of stops adapted to receive the pin to switch the orientation of the contact head relative to the frame.

16. A prober assembly, comprising:
a frame; and
a plurality of contact head assemblies movably coupled to and independently movable along a length of the frame, each contact head assembly comprising:
a housing; and
a movable contact head having a plurality of prober pins disposed on a lower surface thereof, the contact head being pivotable about an axis relative to the housing, wherein the frame includes a plurality of stops disposed adjacent a channel, each stop adapted to receive a pin disposed on each of the contact heads to reorient the direction of the contact head relative to the housing as the housing moves along the channel.

17. A prober assembly for contacting electronic devices on a substrate, comprising:
a frame having a length greater than a width of a substrate; and
a plurality of contact head assemblies movably coupled along the length of the frame, each of the contact head assemblies being independently pivotable relative to the frame, wherein each contact head assembly includes a contact head coupled to a pin and the frame includes at least one stepped portion having a plurality of stops adapted to receive the pin to switch the orientation of the contact head relative to the frame, wherein the frame comprises a motor that is operably coupled to each contact head assembly.

18. A prober assembly, comprising:
a frame; and
a plurality of contact head assemblies movably coupled to and independently movable along a length of the frame, each contact head assembly comprising:
a housing; and
a movable contact head having a plurality of prober pins disposed on a lower surface thereof, the contact head being pivotable about an axis relative to the housing, wherein the frame includes a plurality of stops disposed adjacent a channel, each stop adapted to receive a pin disposed on each of the contact heads to reorient the direction of the contact head relative to the housing as the housing moves along the channel, wherein the frame comprises a motor that is operably coupled to each contact head assembly.

* * * * *